United States Patent
Rose

[11] Patent Number: 5,974,434
[45] Date of Patent: Oct. 26, 1999

[54] METHOD AND APPARATUS FOR AUTOMATICALLY TUNING THE PARAMETERS OF A FEEDBACK CONTROL SYSTEM

[75] Inventor: Ralph E. Rose, 1324 S. Winchester Blvd., #38, San Jose, Calif. 95128

[73] Assignee: Ralph E. Rose, San Jose, Calif.

[21] Appl. No.: 09/048,018

[22] Filed: Mar. 25, 1998

Related U.S. Application Data

[63] Continuation-in-part of application No. 08/946,324, Oct. 7, 1997.

[51] Int. Cl.$^6$ .................................................. G06F 17/10
[52] U.S. Cl. ............................................. 708/322; 364/162
[58] Field of Search .................................... 708/322, 323; 364/157, 162; 375/232

[56] References Cited

U.S. PATENT DOCUMENTS

| | | | |
|---|---|---|---|
| 5,394,322 | 2/1995 | Hansen | 364/148 |
| 5,557,646 | 9/1996 | Honma | 375/232 |
| 5,568,377 | 10/1996 | Seem et al. | 364/157 |
| 5,745,362 | 4/1998 | Hiroi et al. | 364/162 |
| 5,751,902 | 5/1998 | Hofmann | 708/322 |
| 5,774,564 | 6/1998 | Eguchi et al. | 708/322 |

*Primary Examiner*—Tan V. Mai
*Attorney, Agent, or Firm*—Townsend and Townsend and Crew LLP

[57] ABSTRACT

A new technique for adjusting the parameters of a feedback controller. A linear feedback controller includes proportional, integral and derivative (PID) controllers but is not limited to them. The feedback controller may utilize non-linearity in its control and still have its parameters adjusted by this algorithm. The technique involves calculating an error derivative signal, which is the derivative of the processes loops' error with a parameter, for each parameter being adjusted and utilizing these error derivative signals along with error using a modified LMS algorithm. A key aspect of the modified LMS algorithm is the development of the error derivative signals.

18 Claims, 22 Drawing Sheets

METHOD AND APPARATUS FOR AUTOMATICALLY TUNING THE PARAMETERS OF A FEEDBACK CONTROL SYSTEM

CROSS-REFERENCE TO RELATED APPLICATION

This is a continuation-in-part of application Ser. No. 08/946,324, filed Oct. 7, 1997.

TECHNICAL FIELD

The present invention relates generally to feedback control systems and more specifically to the automatic adjustment of the parameters comprising such control systems. The present invention offers the advantage of performing the adjustment during normal operation and uses the natural noise that disturbs the control system in the adjustment process.

BACKGROUND OF THE INVENTION

Feedback control systems have many applications, including temperature control, pressure control and so on. Feedback control systems maintain a controlled variable (e.g. temperature, speed, etc.) about a setpoint based on an error signal, namely the difference between the setpoint value and the actual value of the controlled variable. Control parameters of the feedback controller determine how the error signal is used to develop the feedback signal used to control the system. When a control system is first setup, the control parameters must be adjusted to provide acceptable responsiveness and accuracy of the feedback control system.

An example of a feedback controller is a proportional, integral, and derivative (PID) controller. The technique often used in the past to automatically adjust the parameters of a PID controller is to pass noise around the control loop and adjust the parameters so that the phase and amplitude of the noise coming through the loop is equal and opposite to the noise source. This technique works fine as long as the noise source is representative of the noise that disturbs the control loop when it is controlling the process. The degree to which the two noise sources are not equal is in some measure the degree to which the adjustment of the parameters is not optimal.

What is needed is an automatic tuning controller which provides an accurate estimation of controller parameters based upon the noise that actually disturbs the controlled process variable. It is further desirable that such estimation can be made in real time, while the controller is controlling the process. The method and apparatus should be applicable to both linear and non-linear controllers.

SUMMARY OF THE INVENTION

In accordance with the present invention, the parameters comprising a feedback control system are updated first by computing a error signal, representing the difference between a setpoint value and the value of a process variable being measured. Next, error derivative signals are produced, each representing a derivative of the difference signal with respect to each of the parameters of the feedback controller which are to be updated. Adjustment signals are then produced by combining the difference signal with the error derivative signals. The parameters are then updated by combining the adjustment signals with the parameters.

The production of the error derivative signals includes modeling the transfer function representing an external process comprising the process being controlled and a sensor providing the measurements of the process variable. In one embodiment of the invention, the step of modeling includes providing a digital filter to approximate the external process and adapting the parameters comprising the digital filter. The step of adapting the digital filter parameters include producing an error signal and producing error derivative signals representative of the derivative of the error signal with respect to each of the digital filter parameters.

In one embodiment of the invention, the feed-back controller is a proportional, integral, derivative (PID) type controller. In another embodiment of the invention, the feedback controller is a non-linear controller. In general, the present invention is applicable to both linear and non-linear controllers.

Further in accordance with the present invention, a feedback controller comprises a setpoint selector for specifying a setpoint value, a comparator for producing an error signal based on the setpoint value and the process variable, a control signal generator to produce a control signal based on the error signal, and adjustment means for updating the parameters comprising the control signal generator. The adjustment means includes a derivative signal generator for producing signals representing the derivative of the error signal with respect to each parameter comprising the control signal generator and an adjustment value generator for producing adjustments values with which the parameters are updated.

The advantage of the method of the present invention is that the noise used to adjust the parameters of the feedback controller will be identical to the noise that disturbs the control loop under normal operating conditions. This is because, after the system is setup, the adjustment of the parameters will occur during normal operation of the control loop; i.e. while the controller is controlling the process.

BEST MODE FOR CARRYING OUT THE INVENTION

Recently, I have applied for a patent on a training algorithm of recursive filters and the like. The application (Ser. No. 08/946,324 filed Oct. 7, 1997) describes a technique that permits a recursive filter to be trained using the same technique that has previously been reserved to the training of non-recursive filters, etc. The technique I am referring to is the LMS algorithm. The reason the technique could not be applied to recursive filters was unavailability of the derivative of the output with respect to the recursive parameters being adjusted. This problem was overcome by development of the concept of a derivative function. This concept is summarized in the following equations. Given:

$$Y(z)=H(z)X(z) \quad (1)$$

then:

$$\frac{d(Y(z))}{da_k} = \frac{d(H(z))}{da_k} X(z) \quad (2)$$

The derivative of a transfer function with respect to the a$_k$ parameter in the transfer equation is in fact a new transfer function. When this new transfer function is applied to the original input the result is a derivative signal. The level of a derivative signal is representative of and equal to the derivative of the original function's output with respect to the original parameter. The derivatives can be taken in either the time domain, the z domain or the s domain. The results will be equivalent regardless of the domain in which the derivative is taken.

Moreover, the method and apparatus of the invention is applicable to feedback controllers of all kinds, including controllers having linear and non-linear elements. However, for explanatory purposes only, the following discussion of the best mode of practicing the invention will be made with respect to PID controllers. First, a discussion of a linear PID controller will be presented. Next, a discussion leading to the application of the invention to non-linear feedback control system will be made. Persons of ordinary skill in the art of control systems will readily appreciate the applicability of the present invention to other kinds of controllers.

Figure 3:
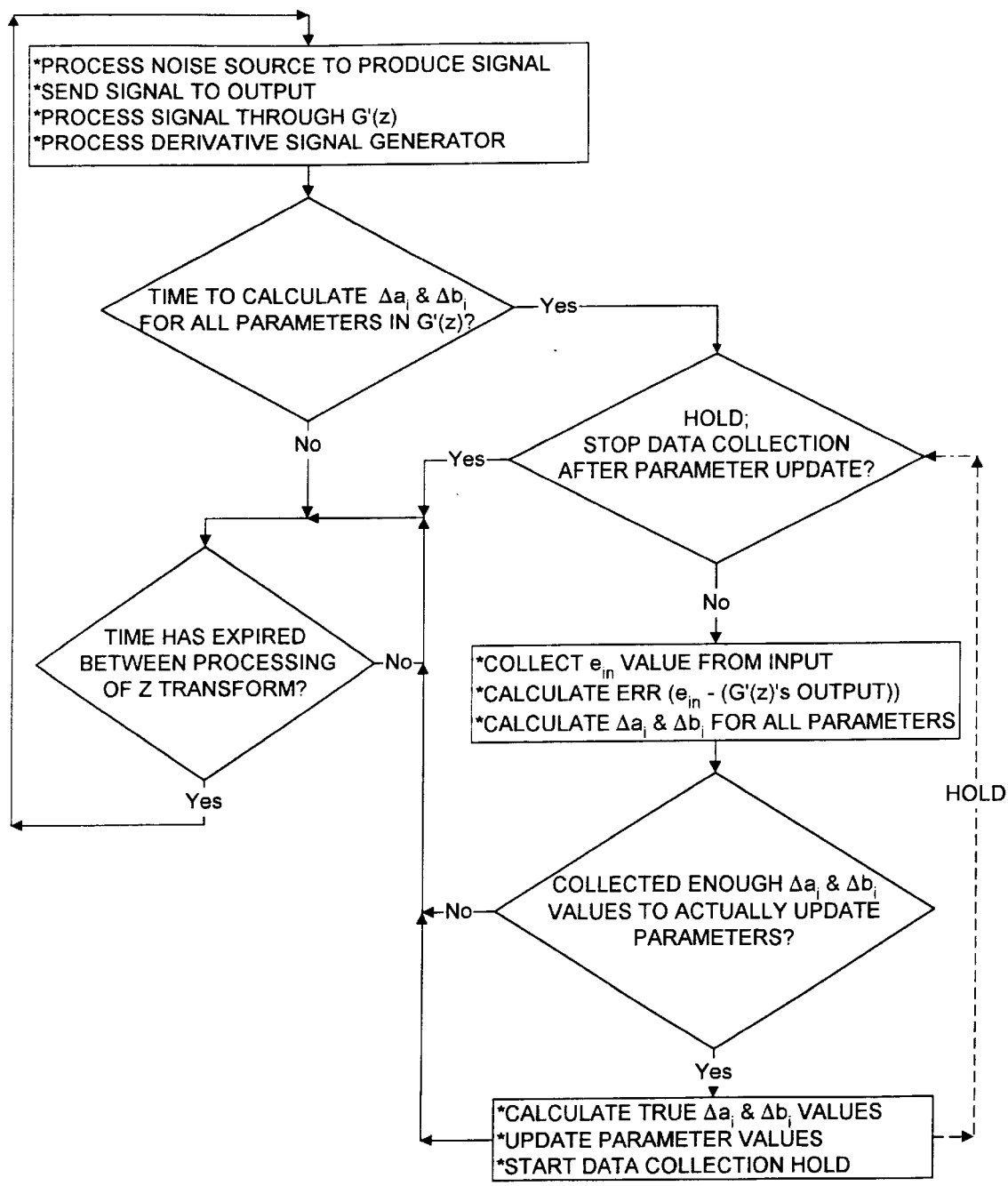
FIG. 3 shows a flow graph for development of a network which approximates the external transfer function between the controller's output and input.
Figure 4:
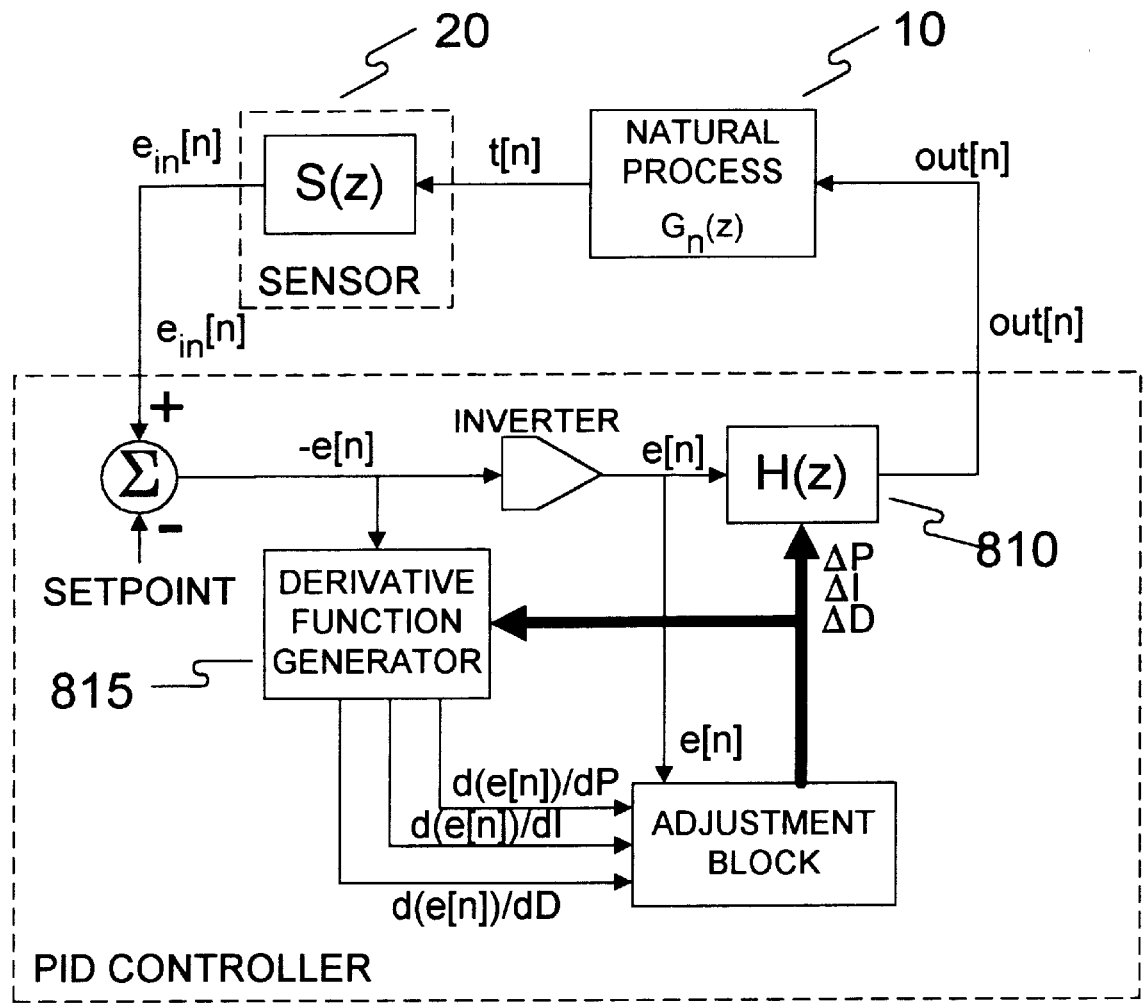
FIG. 4 shows a block diagram for real time adjustment of parameters of a PID controller.

In accordance of the present invention, the adjustment of the PID controller parameters during operation of the control loop is a two step process. The first step in this process is to produce a duplicate transfer function G'(z) which approximates the transfer function that exists between the PID controller's output and the PID controller's input. Using FIG. 4, this transfer function is G$\underline{n}$(z)S(z). This duplicate transfer function is obtained by setting up a synthetic transfer function G'(z) inside the PID controller and adjusting the parameters inside this synthetic network so that its behavior duplicates the external transfer function. This process is summarized in the block diagram shown in FIG. 2 and the flow graph shown in FIG. 3.

Figure 5:
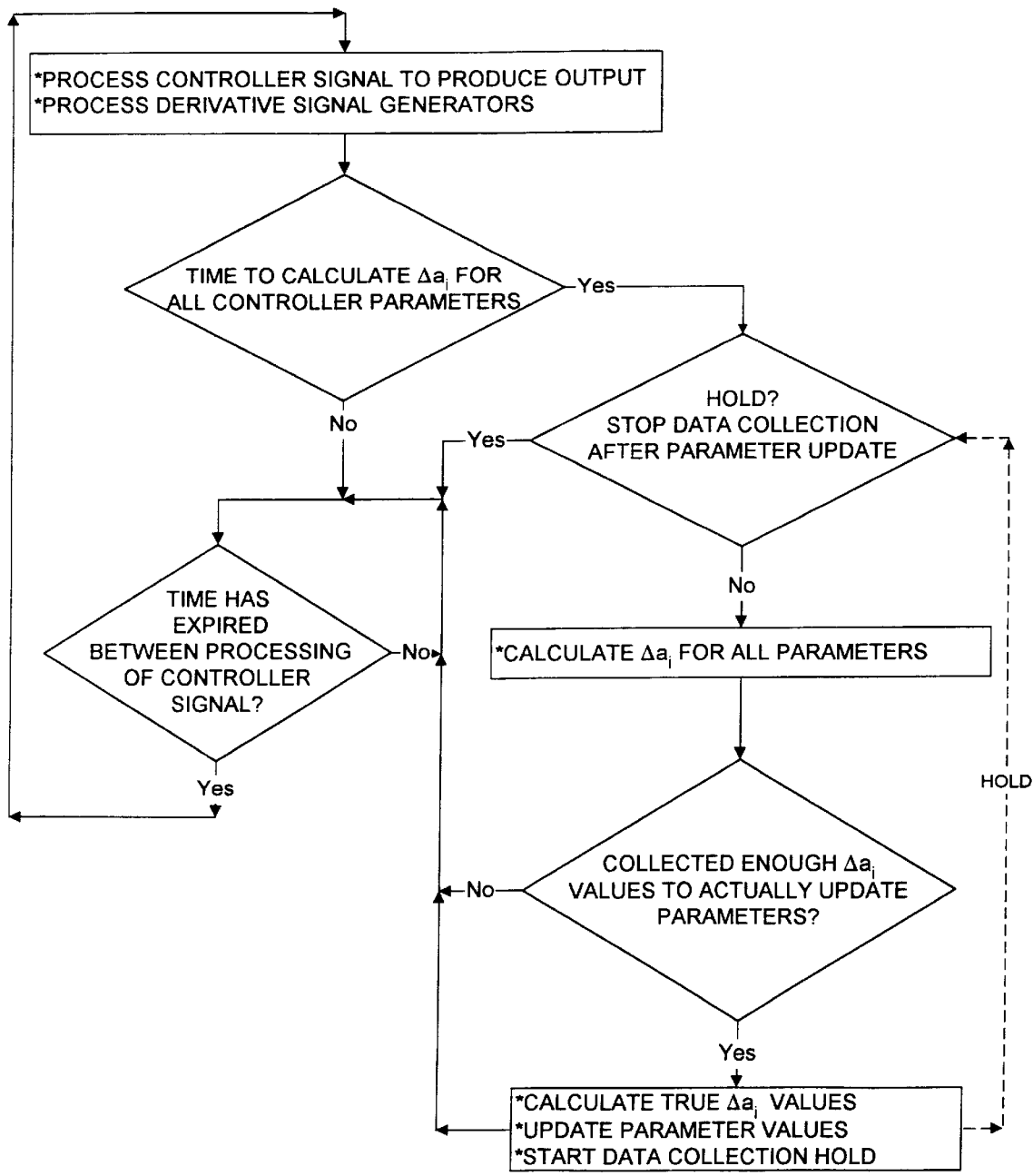
FIG. 5 shows a flow graph for real time adjustment of the parameters of a controller.
Figure 6:
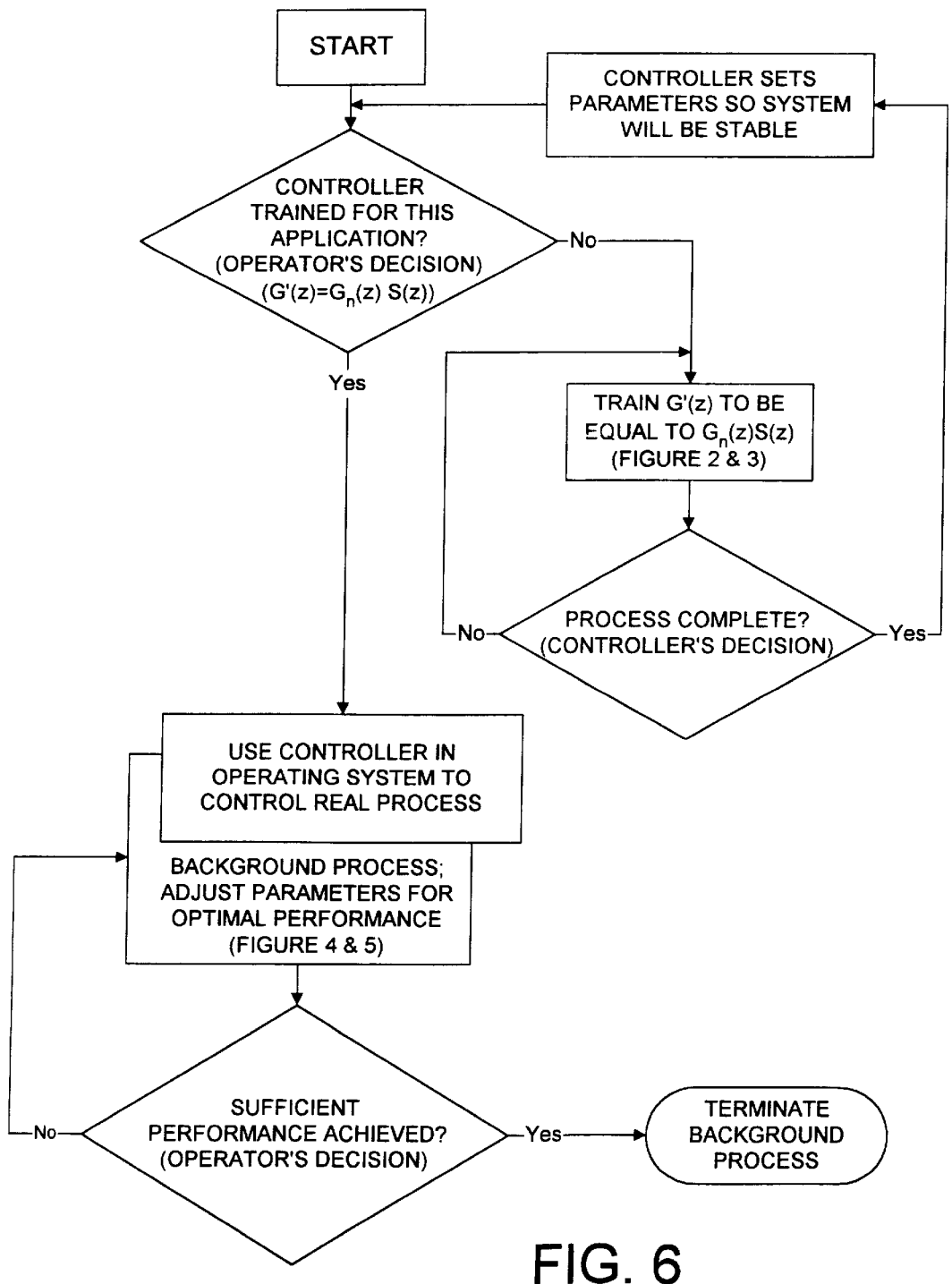
FIG. 6 shows a flow graph for deciding when to perform which part of the two part algorithm, namely (FIGS. 2 and 3, or FIGS. 4 and 5).

Before discussing how this external transfer function can be duplicated, I will discuss the second step of the procedure of my invention, which is how the transfer function will be used to adjust P, I, and D. The process used to adjust the parameters is summarized in the block diagram shown in FIG. 4 and the flow graph shown in FIG. 5. Please observe the similarity between the block diagram shown in FIG. 4 and FIG. 2. One block diagram (FIG. 2) is used to adjust the parameters of G'(z) and the other (FIG. 4) is used to adjust the P, I and D parameters used in a controller. Both block diagrams use a derivative function generator to generate signals representative of the derivative of the error signal with the parameters being adjusted. Also observe the similarity between the flow graphs shown in FIG. 3 and FIG. 5. Both flow graphs show the same pattern of decisions etc. and use the same technique to calculate the adjustment of parameter values.

Since the objective of this exercise is to minimize error, the derivative of all parameters will be taken with respect to error. There are several techniques that can be used to calculate the error derivative signals. One of these techniques is to assume a noise source, and to develop a transfer function between this noise source and the error signal. To obtain the error derivative signal, i.e. the derivative of error with respect to one parameter, the derivative of this transfer function will be calculated. There is another technique that will be developed later. One of the advantages of this technique is that it shows that the technique being developed is not dependent on any assumptions about the location of the noise source. For purpose of this discussion, only one noise source will be considered, and it will be located at the sensor input.

Figure 1:
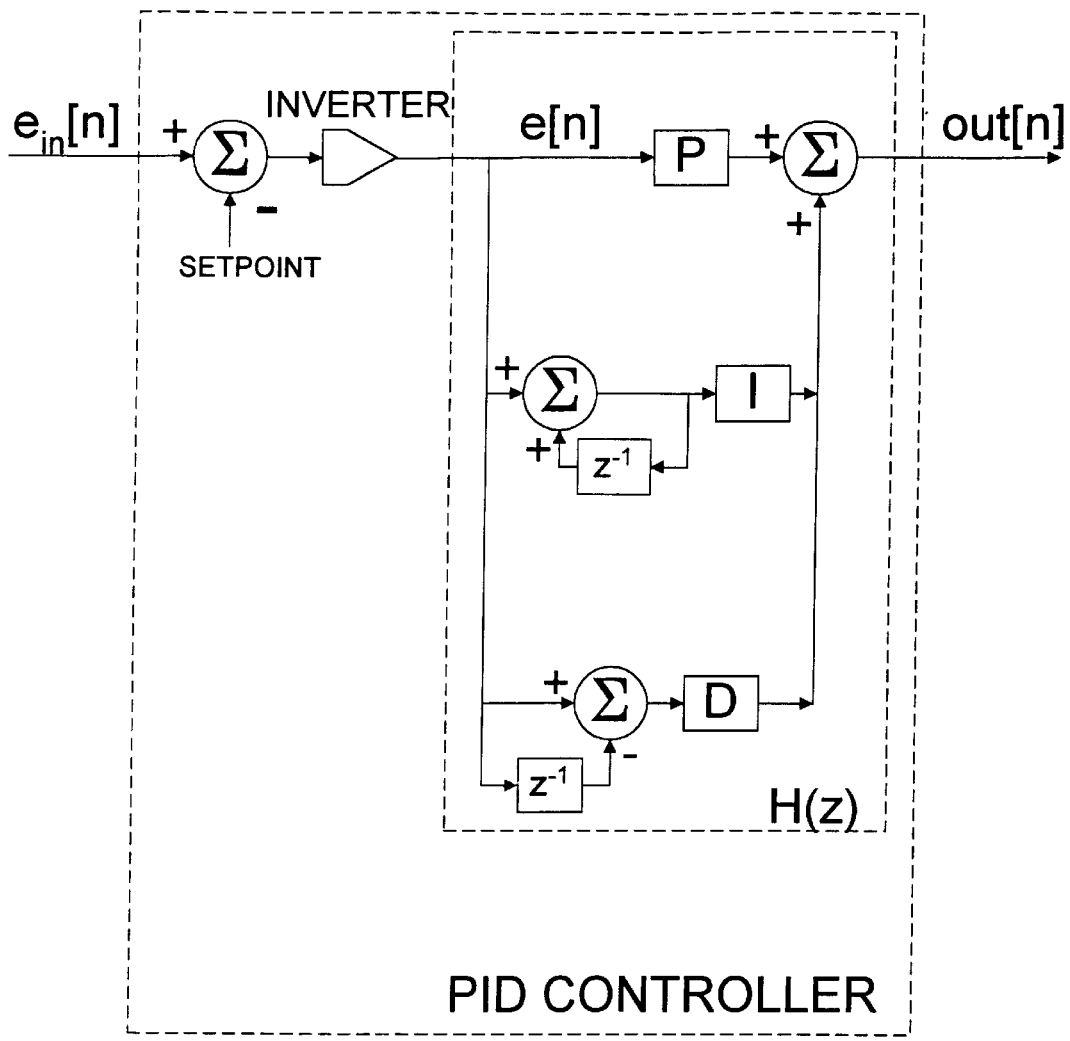
FIG. 1 is a block diagram of a typical PID controller.

The flow graph of the PID controller that will be used in this analysis is shown in FIG. 1 and has the transfer equations in z-transform notation shown below:

$$E(z) = -E_{in}(z) + S.P. \quad (3)$$

$$\text{OUT}(z) = E(z)\left(P + \frac{I}{1+z^{-1}} + D(1-z^{-1})\right) \quad (4)$$

where S.P. represents a setpoint value, P represents a proportional constant, I represents an integration constant and D represents a derivative constant. Please observe the inverter between the summer and the definition of the signal E(z). This inverter is necessary, for example, in a heater controller, but not in a cooling controller. In a heater controller, high output will produce heat which increases the temperature and increases the PID's input signal. In order for there to be negative feedback around the control loop, it is necessary to incorporate the inverter.

In Equations (3) and (4), the value of error that will average about zero will be E(z) not $E_{in}(z)$. $E_{in}(z)$ will be offset from zero by the value of the set-point. It will be E(z) that will be minimized.

Figure 7:
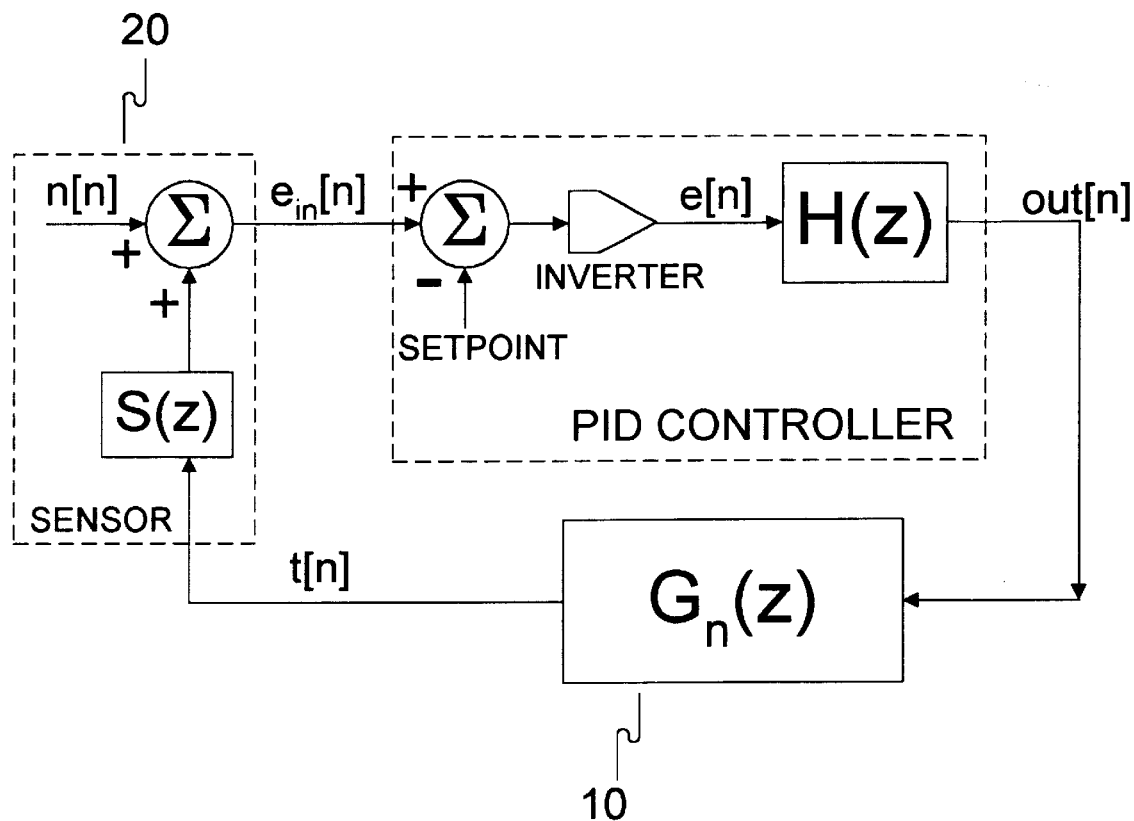
FIG. 7 shows a simplistic block diagram of the PID control loop.

The signal flow diagram of a PID controller used in normal operation is shown in FIG. 7. This flow diagram will be used to develop the auto-tuning algorithm of the present invention. A controlled process, shown using z-transform notation includes a PID controller which provides an output signal OUT(z) that feeds into process $G_n(z)$. The response T(z) from process $G_n(z)$ feeds into a sensor. The sensor as shown is FIG. 7 is represented by the transfer function S(z) and a summer where a "noise" signal N(z) is added. As an example, the process $G_n(z)$ may be transfer function between the control signal OUT(z) to a heater and the resulting temperature T(z).

In the flow graph of FIG. 7 the noise source that disturbs the control loop is considered to be located at the sensor and in the case of temperature control is caused by air currents, etc. In this flow graph the transfer function between noise N(z) and error E(z) is:

$$E(z) = \frac{-N(z) + S.P.}{1 + G_n(z)S(z)H(z)} \quad (5)$$

In FIG. 7 and Equation (5), H(z) represents the transfer function of the PID controller, while $G_n(z)$ represents the transfer function between the output of the PID controller and the variable actually being controlled—as shown in FIG. 7 this variable is T(z).

The objective is to adjust the parameters (P, I, and D) so as to minimize error. This requires finding the derivative of error E(z) with respect to each of these parameters.

$$\frac{d(E(z))}{dP} = \frac{-(-N(z) + S.P.)G_n(z)S(z)}{(1 + G_n(z)S(z)H(z))^2} \frac{d(H(z))}{dP} \quad (6)$$

Since d(H(z))/dP is equal to 1, the above equation can be rearranged to:

$$\frac{d(E(z))}{dP} = -\left(\frac{-N(z) + S.P.}{1 + G_n(z)S(z)H(z)}\right)\left(\frac{G_n(z)S(z)}{1 + G_n(z)S(z)H(z)}\right) \quad (7)$$

Since the left term on the right hand side of the above equation is equal to E(z), the above equation can be simplified to:

$$\frac{d(E(z))}{dP} = \frac{-G_n(z)S(z)E(z)}{1 + G_n(z)S(z)H(z)} \quad (8)$$

By following a similar procedure the derivatives for the other two parameters can be obtained.

$$\frac{d(E(z))}{dI} = \left(\frac{-G_n(z)S(z)E(z)}{1 + G_n(z)S(z)H(z)}\right)\left(\frac{1}{1 + z^{-1}}\right) \quad (9)$$

$$\frac{d(E(z))}{dD} = \left(\frac{-G_n(z)S(z)E(z)}{1 + G_n(z)S(z)H(z)}\right)(1 - z^{-1}) \quad (10)$$

The source of the signal that drives the transfer function (derivative functions) shown in Equations (8), (9) and (10) is the error signal E(z), not the noise signal N(z). If we make the assumption that another function existed that had a transfer function very similar to $G_n(z)S(z)$, then it would be possible to construct a flow graph to develop these derivative signals. The flow graph built on this assumption is presented in the embodiment of the present invention shown in FIG. 8. The block having a transfer function very similar to $G_n(z)S(z)$ is labeled G'(z). This is the reason it is necessary to develop a transfer function that has identical characteristics to $G_n(z)S(z)$, the transfer function between the PID's output and input.

Figure 8:
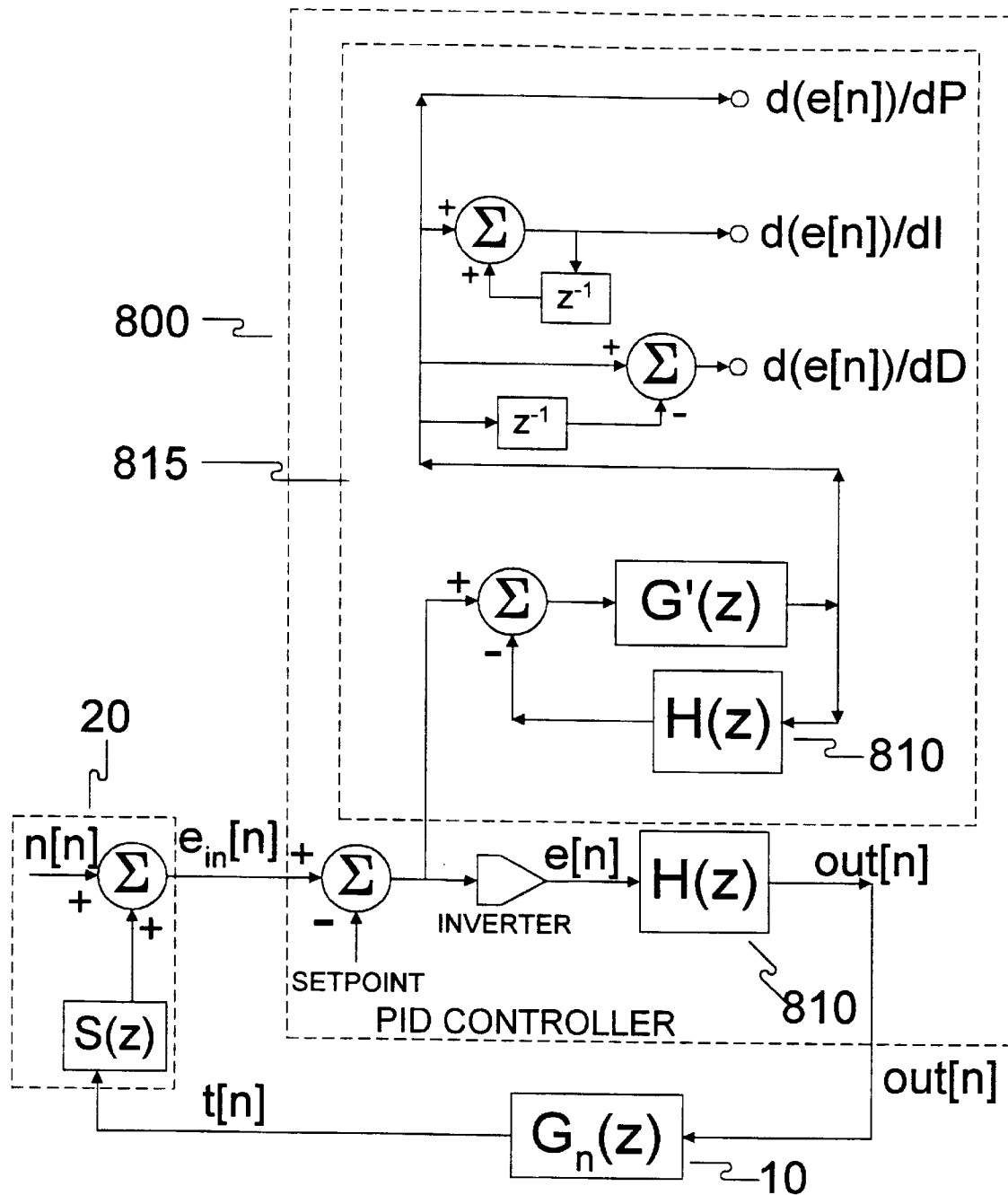
FIG. 8 shows a flow graph for the development of derivative functions required for tuning of the PID controller parameters.

In FIG. 8, the PID controller 800 of the present invention includes the controller portion 810 and a derivative generator portion 815. Observe that the controller portion 810 is duplicated in the derivative generator portion 815. The derivative generator portion 815 produces the error derivative signals as shown in Equations (8), (9) and (10). As will be discussed below, these error derivative signals along with the error signal are used to adjust the P, I and D parameters in both of the controller portions 810.

Before the technique for the development G'(z) is discussed, I will continue with the discussion of how to adjust the parameters P, I, and D. To adjust the parameters the technique developed in my previous application will be used. That application dealt with the training of recursive filters using derivative functions. Before this technique can be applied in this situation there are some things that need to be understood. The error signal discussed in that application is not the same error expressed in this application. The error in the previous application refers to the difference between a desired signal and the actual signal, while the error discussed in this application refers to the actual signal. Since the desired signal (error) is zero the sign must be changed in the equation used to calculate the change of parameter values.

$$\Delta P = -\frac{\left(\frac{d(e[n])}{dP}\right)e[n]}{KK_2} \quad (11)$$

$$\Delta I = -\frac{\left(\frac{d(e[n])}{dI}\right)e[n]}{KK_2} \quad (12)$$

$$\Delta D = -\frac{\left(\frac{d(e[n])}{dD}\right)e[n]}{KK_2} \quad (13)$$

Where K equals:

$$K = \left(\frac{d(e[n])}{dP}\right)^2 + \left(\frac{d(e[n])}{dI}\right)^2 + \left(\frac{d(e[n])}{dD}\right)^2 \quad (14)$$

and $K_2$ is an arbitrary positive constant used to assure stability during the adjustment process.

As discussed in the previous application due to the delay required between the change of the parameter values and the collection of parameter update data, the number of actual updates of the parameters will be restricted. The delta or change values (ΔP, ΔI, ΔD) calculated at each time the update equations are processed are averaged with other delta values before being used to actually change the parameter values.

$$\Delta P_{actual} = \frac{1}{NUM} \sum_{m=1}^{NUM} \Delta P(m) \tag{15}$$

$$\Delta I_{actual} = \frac{1}{NUM} \sum_{m=1}^{NUM} \Delta I(m) \tag{16}$$

$$\Delta D_{actual} = \frac{1}{NUM} \sum_{m=1}^{NUM} \Delta D(m) \tag{17}$$

Where the parameter update equations are:

$$P = P + \Delta P_{actual} \tag{18}$$
$$I = I + \Delta I_{actual} \tag{19}$$
$$D = D + \Delta D_{actual} \tag{20}$$

Figure 9:
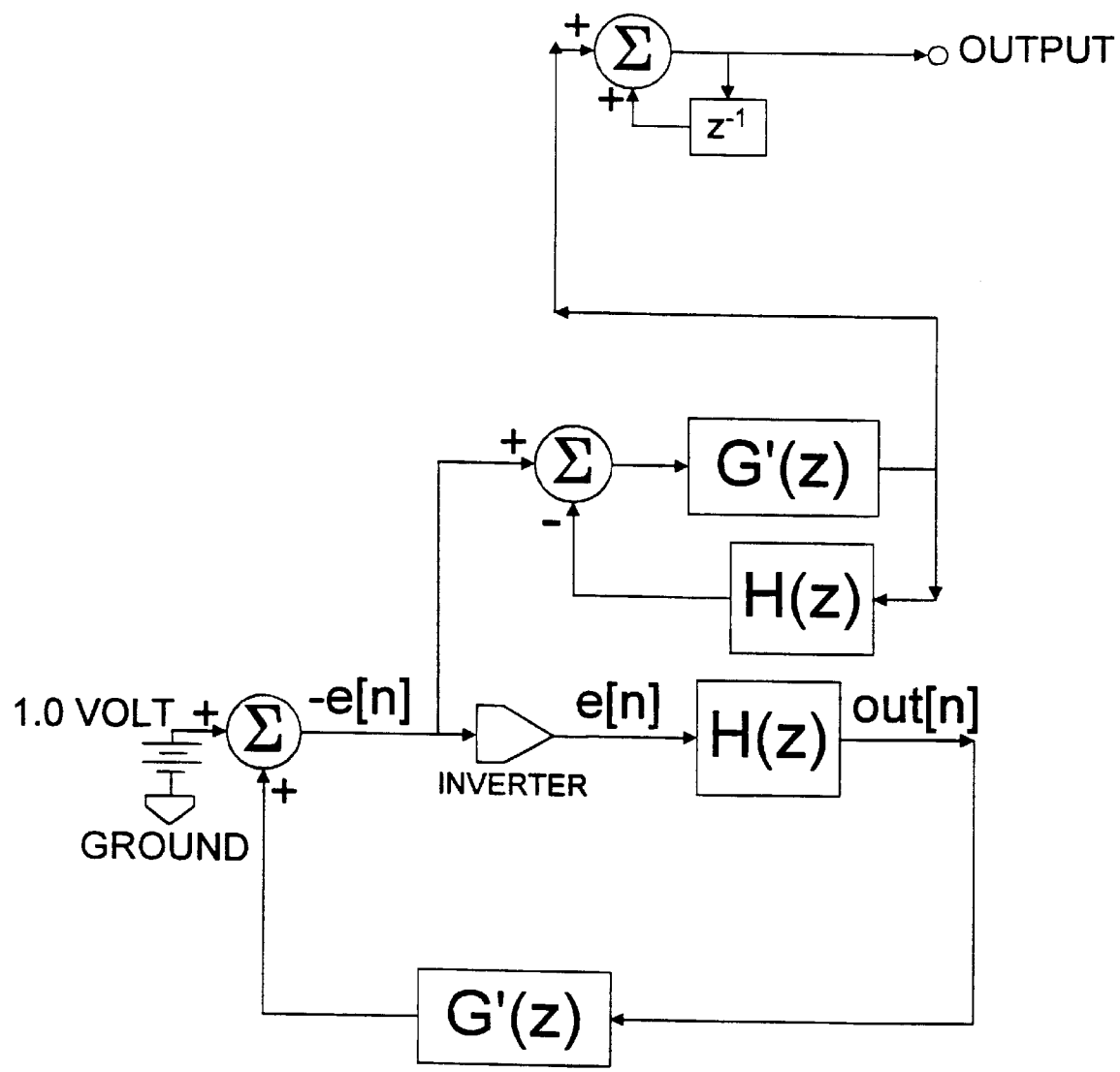
FIG. 9 shows a block diagram of a test circuit for determining how long to wait after updating P, I and D parameters before collecting parameter update data.

Another problem related to this procedure is how long to wait after the parameters have been updated before collecting new parameter update data. As was discussed in the previous application, a test circuit can be built that receives a constant input and whose only disturbance of its output is the change of parameters. The time required for the test circuit to stabilize after the parameters have been updated, can be used to determine how long it is necessary to wait after the parameters have been changed. The test circuit for FIG. 8 is shown in FIG. 9. The test circuit is identical to the original circuit, the only difference is that the serial combination of $G_n(z)$ and $S(z)$ has been replaced by $G'(z)$. When the value of the parameters are changed the output of the test circuit will be disturbed. This disturbance is representative of the error in the derivative signals used to update the parameters. After this fluctuation has died out there will be no error in the derivative signals.

Creation of Transfer Function Equivalent to $G_n(z)S(z)$

The remaining problem in the system is the creation of a network that is functionally equivalent to $G_n(z)S(z)$, namely $G'(z)$ shown in FIG. 8.

Figure 2:
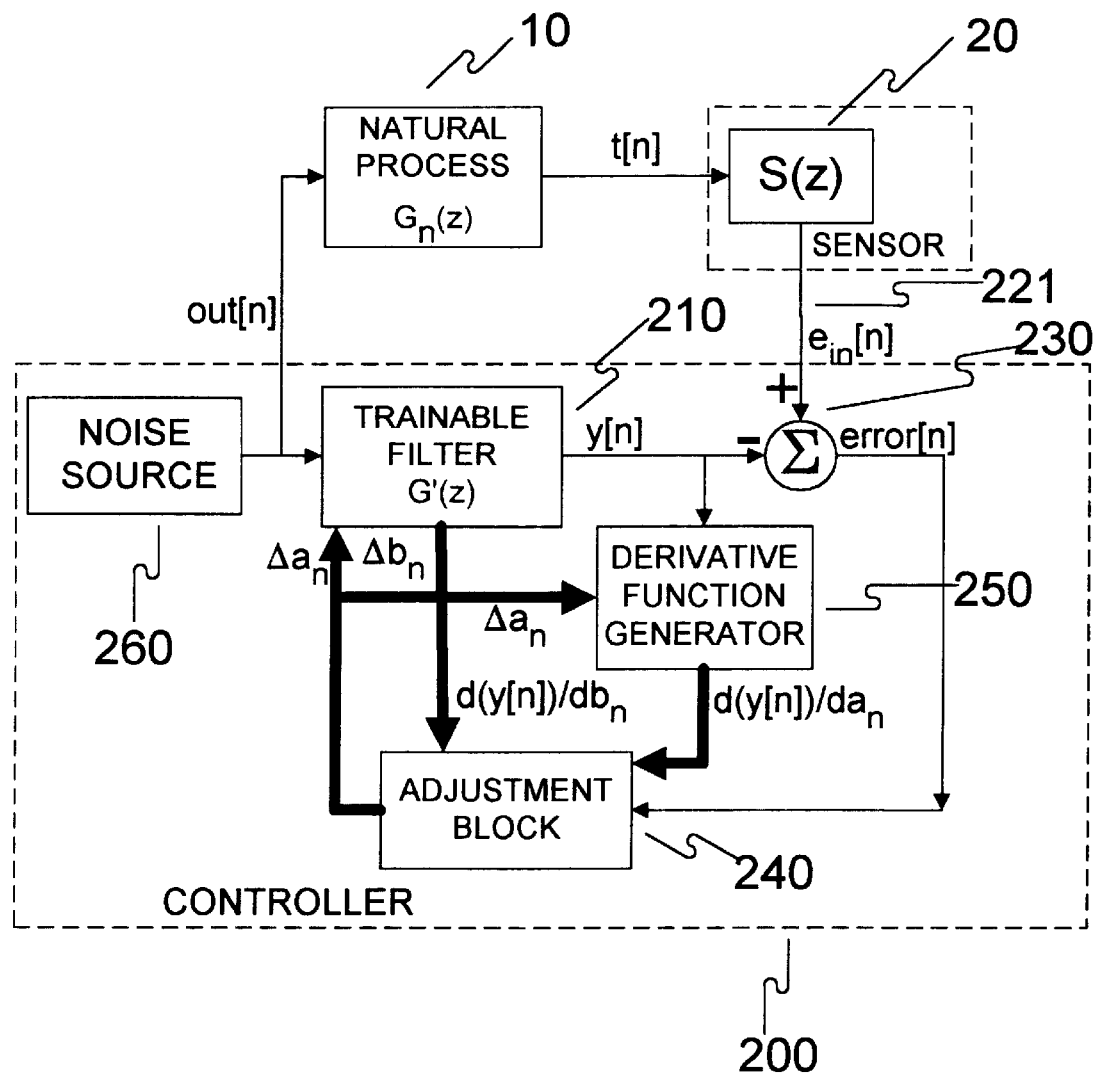
FIG. 2 shows the block diagram for development of a network which approximates the external transfer function between the controller's output and input.

The block diagram used for adjustment of the parameters of the circuit capable of being a functionally equivalent network to $G_n(z)S(z)$ is shown in FIG. 2. The adaptive system 200 includes filter 210 whose behavior is characterized by a set of recursive and non-recursive filter coefficients (parameters). The broad lines from filter 210 and the derivative function generator 250 represent the derivatives of the parameters with respect to the output of filter 210. These derivatives are used with the error signal to determine the amount the parameters should be changed. The signal flow from parameter adjustment block 240 represents the amount the parameters should be changed as calculated in each update interval.

The output signal y[n] produced by filter 210 feeds into summer 230 and is subtracted from the desired signal 221 to produce an error signal. The output signal also feeds into a derivative function generator 250 which produces the derivative signals representative of the derivatives of the output signal with respect to each of the recursive filter parameters. Both the error signal and the derivative signals are combined in the parameter adjustment block 240 to produce delta values for updating the filter parameters. The desired signal 221 is the response to the noise source 260 of the serial combination of the natural process $G_n(z)$ and the sensor $S(z)$.

Figure 10:
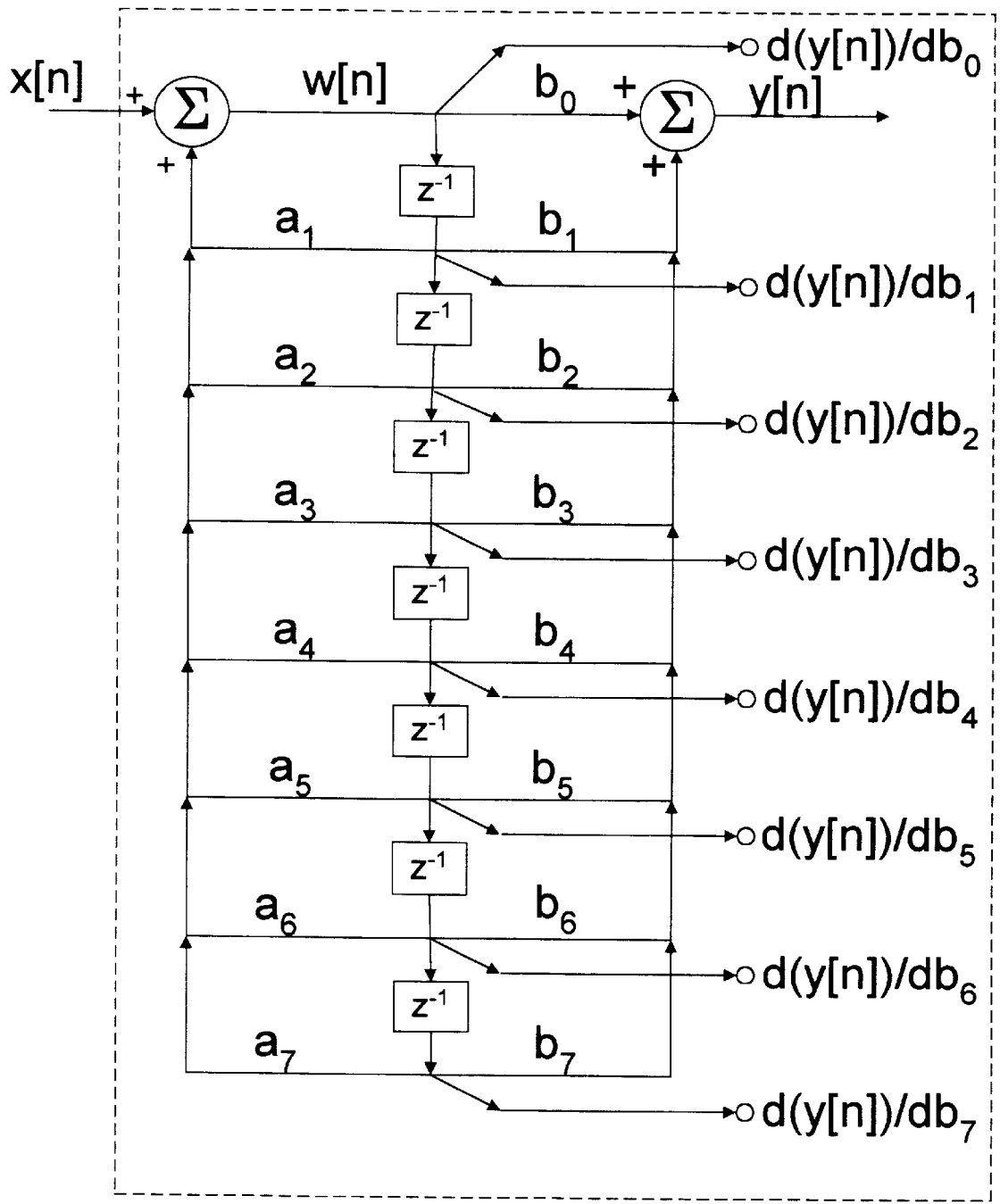
FIG. 10 shows a network with adjustable parameters that can be made equivalent to the external transfer function with the derivative signals for non-recursive parameters.
Figure 11:
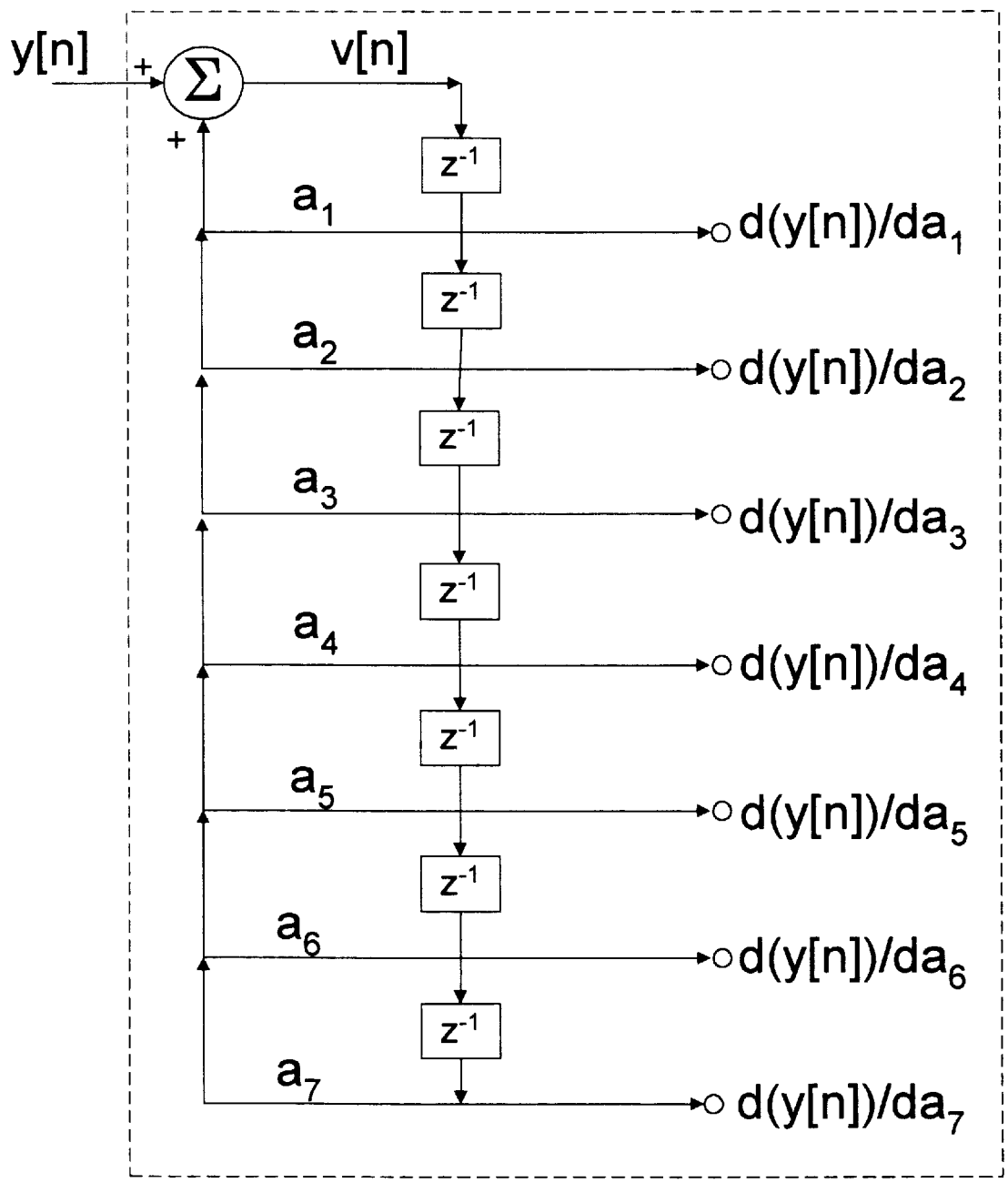
FIG. 11 shows a derivative function generator capable of generating derivative signals for recursive parameters of the network shown in FIG. 10.

The circuit with the adjustable parameters in it capable of being functionally equivalent to $G_n(z)S(z)$, namely filter 210, has the form shown in FIG. 10. This figure also shows the development of the derivative signals for the non-recursive parameters. The derivative function generator 250 capable of developing the derivative signals for the recursive parameters in FIG. 10 is shown in FIG. 11. Although the technique required for adjustment of the parameters in FIG. 10 are described in my previous application the equations will be repeated:

$$\Delta a_i = \frac{\left(\frac{d(y[n])}{d a_i}\right) e[n]}{KK_2} \tag{21}$$

$$\Delta b_i = \frac{\left(\frac{d(y[n])}{d b_i}\right) e[n]}{KK_2} \tag{22}$$

where K is determined by:

$$K = \sum_{i=0}^{M} \left(\frac{d(y[n])}{d b_i}\right)^2 + \sum_{i=1}^{N} \left(\frac{d(y[n])}{d a_i}\right)^2 \tag{23}$$

and the value of $K_2$ is an arbitrary positive constant used to assure stability of the system during parameter adjustment.

The delta values computed in Equations (21) and (22), however, represent instantaneous values and therefore are not appropriate for updating the parameters. Rather, averaged values are produced by sampling over a period of time and averaging the sample. Equations (24) and (25) show that NUM samples are taken and averaged to produce delta values more suitable for updating the parameters as shown in Equations (26) and (27).

$$\Delta a_{i,actual} = \frac{1}{NUM} \sum_{m=1}^{NUM} \Delta a_i(m) \tag{24}$$

$$\Delta b_{i,actual} = \frac{1}{NUM} \sum_{m=1}^{NUM} \Delta b_i(m) \tag{25}$$

$$a_i = a_i + \Delta a_{i,actual} \tag{26}$$

$$b_i = b_i + \Delta b_{i,actual} \tag{27}$$

Figure 12:
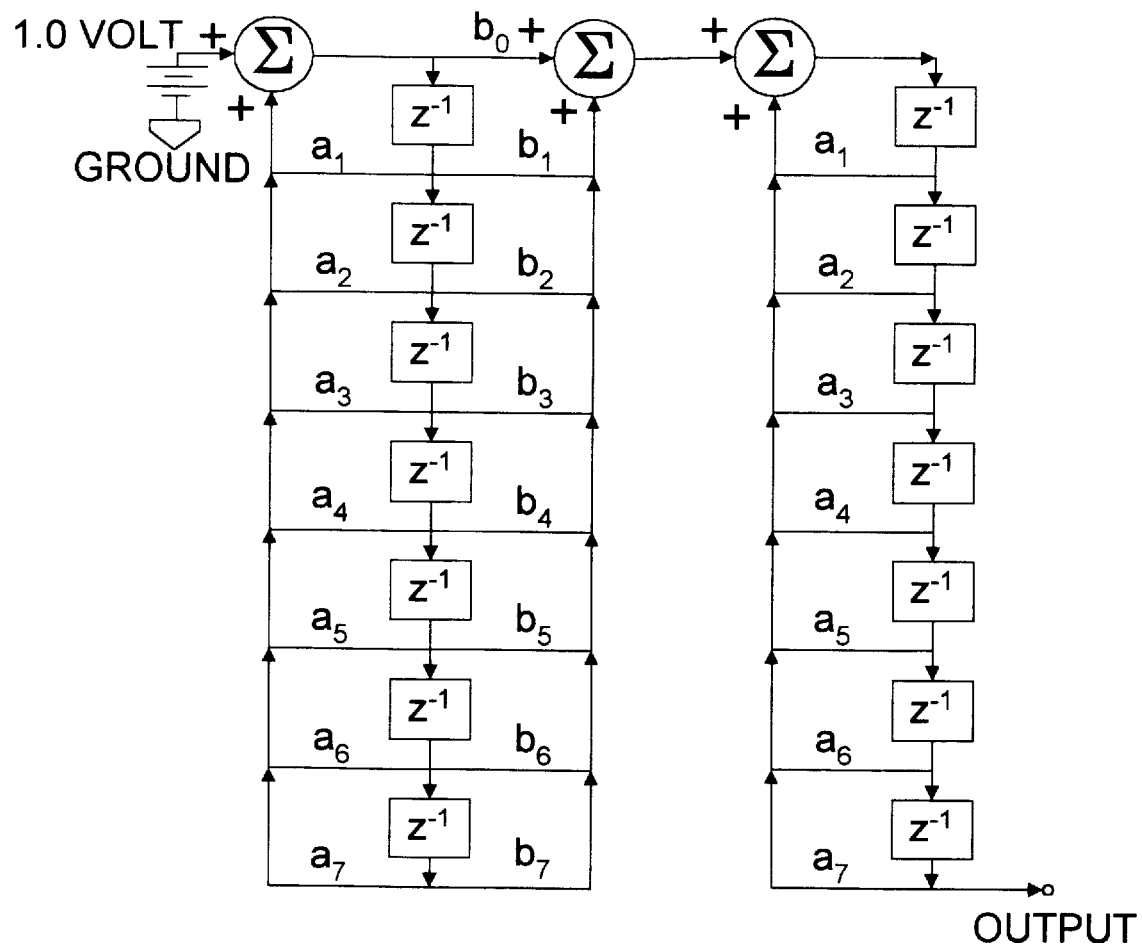
FIG. 12 shows a test circuit for determining how long to wait after updating the parameters of G'(z) before collecting parameter update data.

As in the adjustment of the parameters in a recursive filter, the problem of how long to wait after the parameter values have been updated before collecting new parameter update data. As discussed in my previous application, a test circuit can be used. The test circuit is identical to the series combination of the filter and the derivative function generator. The major difference is that the test circuit does not process a signal, but instead receives a constant voltage input. When the parameters in the test circuit are changed, the output signal will be disturbed. The amount of this disturbance is an indication of the inaccuracy of the derivative signals produced by the derivative function generator. The time required by the test circuit output to stabilize, can be used to indicate how long it is necessary to wait before collecting new parameter update data. The test circuit for the filter and derivative function generator combination shown in FIGS. 10 and 11, is shown in FIG. 12.

Training of Non-Linear System

The technique used to develop the derivative signals used when dealing with a linear system is no longer adequate for non-linear systems and as a result an alternate more powerful technique will be developed. This technique involves writing a sequence of equations defining the signal as it is passed around the control loop. An assumption is then made that the derivative signal exists, and this signal is passed around the control loop. Since this is a recursive system, the initial assumption is proven to be correct and all signals are defined. The derivative of the error signal with the adjustable parameter is then expressed in terms of a sequence of equations that can be reduced to a flow graph. This flow graph will always require some input signal from the real control loop, and as a result the real control loop must be monitored so that the value of various terms derived from the non-linearity be updated to reflect their real value. The non-linearity that will be used will be a power series of the form:

$$f(e) = \sum_{m=1}^{M} a_m e^m \tag{28}$$

The signal that is passed around the control loop is the derivative of the normal signal with a parameter. The signal that passes through the non-linearity takes two forms. When the parameter is part of the non-linearity, the following equations apply:

$$\text{out} = f(e) \tag{29}$$

$$\frac{d\,\text{out}}{da} = \left(\frac{df}{de}\right)\left(\frac{de}{da}\right) + \frac{df}{da} \tag{30}$$

The values of df/de and df/da are values that vary as a function of e signal into the non-linearity in the actual control loop. The value of de/da is the value of the derivative signal inputted to the non-linearity, and dout/da is the value of the derivative signal outputted by the non-linearity.

When the parameter is not a member of the particular non-linearity, the value of df/da is zero and drops out of the equation.

When dealing with a system containing a non-linearity care must be exercised to make sure that the order of functions or operations on a variable do not get changed. This can easily be accomplished by working with the individual equations to produce the transfer equations for the derivative equations, and then reassemble this new set of transfer equations into a new flow graph.

Figure 13:
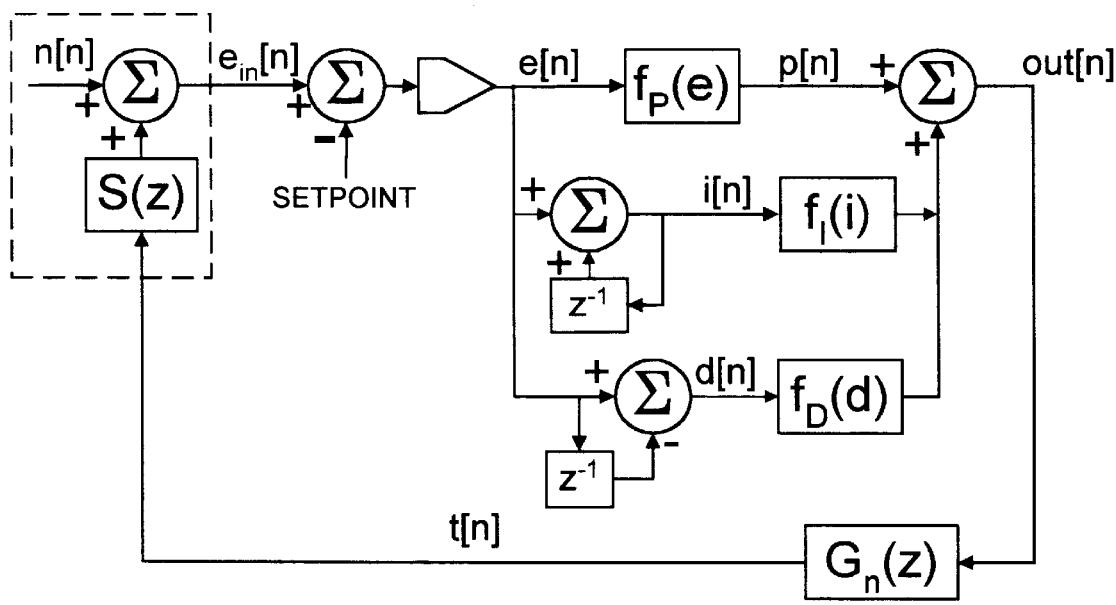
FIG. 13 shows a controller incorporating three power series non-linear elements used in a control loop.

To illustrate this procedure of developing the flow graph for calculating the derivative function for a system containing a non-linearity, the parameters in a normal PID controller will be replaced with a power series non-linearity. The P, I, and D parameters will be replaced with $f_P(e)$, $f_I(i)$, and $f_D(d)$ respectively. This new controller configuration is shown in FIG. 13.

Figure 14:
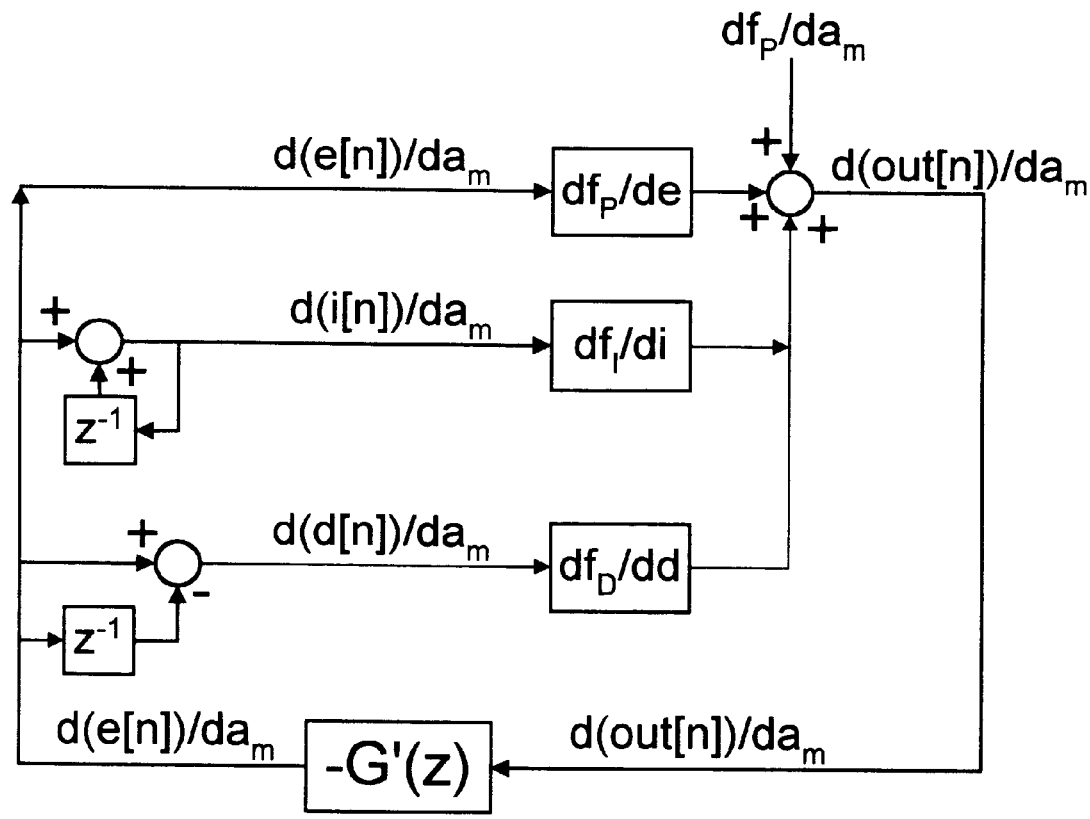
FIG. 14 shows a flow diagram for determining the derivative signal d(e[n])/da$_i$ for parameters associated with the non-linear element f$_p$(e).
Figure 15:
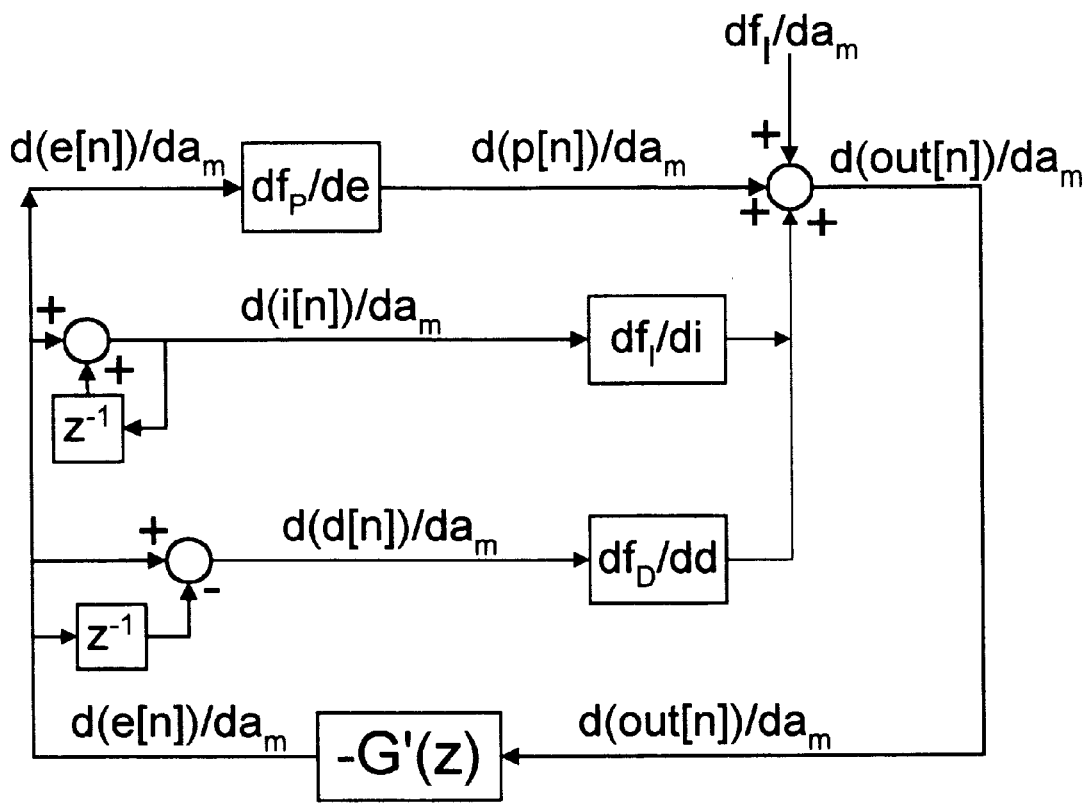
FIG. 15 shows a flow diagram for determining the derivative signal d(e[n])/da$_i$ for parameters associated with the non-linear element f$_I$(e).
Figure 16:
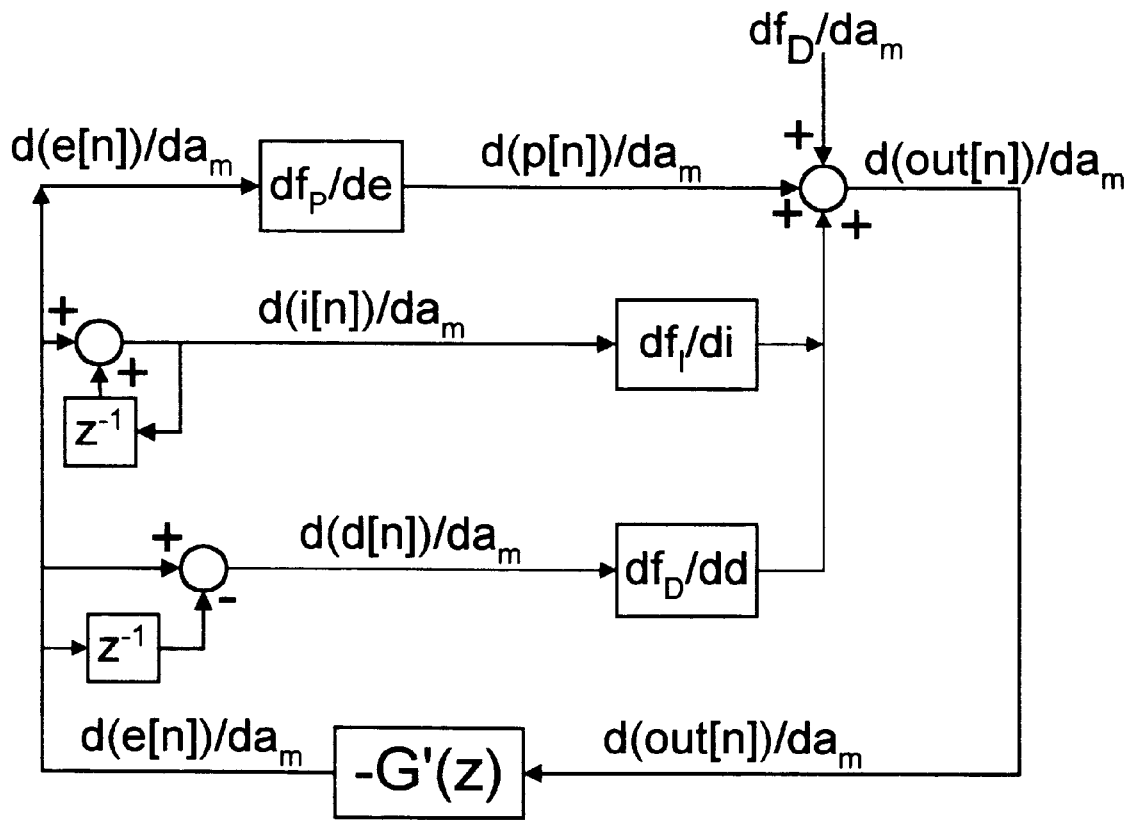
FIG. 16 shows a flow diagram for determining the derivative signal d (e[n])/da$_i$ for parameters associated with the non-linear element f$_D$(e).

FIG. 14, 15 and 16 are flow graphs for calculation of the derivative functions for parameters associated with $f_P(e)$, $f_I(i)$ and $f_D(d)$ respectively. Remember, one of these flow graphs must be processed for each parameter in the non-linearity. It is only then that the error derivative signals for all parameters will be known and the LMS correction algorithm can be applied. The discussion will cover only the generic parameter $a_m$, but remember m must take on all values from one to M for each of the functions $f_P$, $f_I$ and $f_D$. Also note that there will be an $a_m$ for each function. The a$_m$ from the flow graph of FIG. 14, 15 and 16 will be for the $a_m$ associated with $f_P$, $f_I$ and $f_D$ respectively.

Based on the definition of f(e) by Equation 28, a number of terms contained in FIG. 14, 15 and 16 will be defined.

$$\frac{df_P}{da_m} = e^m \quad \frac{df_I}{da_m} = i^m \quad \frac{df_D}{da_m} = d^m \tag{31}$$

$$\frac{df_P}{de} = \sum_{m=1}^{M} m a_m e^{m-1} \quad \frac{df_I}{di} = \sum_{n=1}^{M} m a_m i^{m-1} \quad \frac{df_D}{dd} = \sum_{m=1}^{M} m a_m d^{m-1} \tag{32}$$

The technique that was previously outlined for the development of the flow graphs shown in FIGS. 14, 15, and 16 will now be used. The first step in this process is to list all the equations defining all the variables used in FIG. 13.

$$E_{in}(z) = N(z) - S(z)T(z) \tag{33}$$

$$E(z) = -(E_{in}(z) - S.P.) \tag{34}$$

$$p[n] = f_P(e[n]) \tag{35}$$

$$I(z) = \frac{E(z)}{1 - z^{-1}} \tag{36}$$

$$D(z) = E(z)(1 - z^{-1}) \tag{37}$$

$$\text{out}[n] = p[n] + f_I(i[n]) + f_D(d[n]) \tag{38}$$

$$T(z) = G_n(z)OUT(z) \tag{39}$$

Note the mixed notation used in this set of equations. The linear equations are expressed in z notation, while the non-linear equations are expressed in varable time indexed notation. The equations expressed in z notation also can be expressed in variable time index notation, but not as efficiently. To reduce the number of equations, the results of Equations (33), (34) and (39) will be combined.

$$E(z) = -N(z) + S.P. - S(z)G_n(z)OUT(z)$$

This equation can simplified by replacing $S(z)G_n(z)$ with $G'(z)$.

$$E(z0 = -N(z0 + S.P. - G'(z)OUT(z) \tag{40}$$

When the derivative of this equation is taken with respect to a parameter, the only variables that will actually vary and hence remain are E(z) and OUT(z). The other variables, N(z) and S.P. will drop out of the equation. The variables that remain can also be expressed in z notation, resulting in:

$$\frac{d(E(z))}{da_m} = -G'(z)\frac{d(OUT(z))}{da_m}$$

This notation may be confusing because the z applies to the entire derivative not just the numerator. The remaining parts of FIG. 14, 15 and 16 result from a straight forward application of Equation 29 to $f_P$, $f_I$, and $f_D$, and then simplifying when the parameter is not part of the function.

To illustrate the accuracy of the technique for handling non-linear systems, the block diagram of FIG. 15 will be reduced to a linear system and shown that the results is equivalent to the block diagram of FIG. 8. If the following equations are true:

$$f_P(e[n]) = PE[n]; \; f_I(i[n]) = Ii[n]; \; f_D(d[n]) = Dd[n]$$

then:

$$\frac{df_P}{de} = P; \quad \frac{df_I}{de} = I; \quad \frac{df_D}{de} = D; \quad \frac{df_I}{da_n}\bigg|_{a_n=1} = e$$

Figure 17:
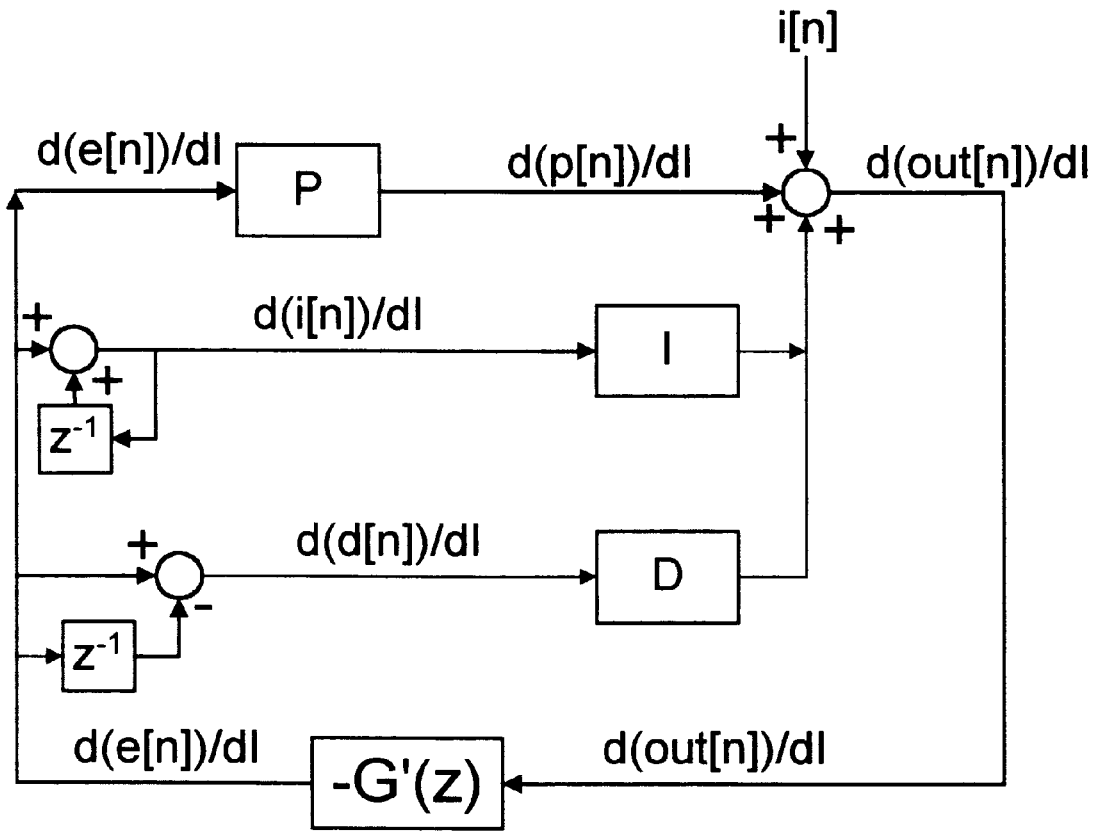
FIG. 17 shows a flow diagram for determining d(e[n])/dI when f$_p$(e), f$_I$(e) and f$_D$(e) in FIG. 13 through FIG. 16 are reduced to linear functions.

By making these substitutions into FIG. 15, the result is FIG. 17. The z transforms of all the variables in FIG. 17 are:

$$\frac{d(OUT(z))}{dI} = P\left(\frac{d(E(z))}{dI}\right) + I\left(\frac{d(I(z))}{dI}\right) + D\left(\frac{d(D(z))}{dI}\right) + I(z) \quad (41)$$

$$\frac{d(I(z))}{dI} = \left(\frac{1}{1+z^{-1}}\right)\left(\frac{d(E(z))}{dI}\right) \quad (42)$$

$$\frac{d(D(z))}{dI} = D(1-z^{-1})\left(\frac{d(E(z))}{dI}\right) \quad (43)$$

$$\frac{d(E(z))}{dI} = -G'(z)\left(\frac{d(OUT(z))}{dI}\right) \quad (44)$$

$$I(z) = \frac{I}{1+z^{-1}} \quad (45)$$

By substituting the results of Equations (42), (43), and (45) into Equation (41) and rearranging the result is:

$$\frac{d(OUT(z))}{dI} = \left(P + \frac{I}{1+z^{-1}} + (1-z^{-1})D\right)\frac{d(E(z))}{dI} + \frac{E(z)}{1+z^{-1}} \quad (46)$$

Equation (46) can be simplified by realizing that the expression inclosed in the parenthesis is the value of H(z).

$$\frac{d(OUT(z))}{dI} = H(z)\left(\frac{d(E(z))}{dI}\right) + \frac{E(z)}{1+z^{-1}} \quad (47)$$

If the results of Equation (47) are substituted into Equation (44) the results is rearranged:

$$(1 + G'(z)H(z))\frac{d(E(z))}{dI} = \frac{-G'(z)E(z)}{1+z^{-1}}$$

By dividing both sides of the above equation by the item enclosed in the parenthesis on the left, the results is:

$$\frac{d(E(z))}{dI} = \frac{-G'(z)E(z)}{(1+G'(z)H(z))(1+z^{-1})} \quad (48)$$

Please observe the similarity between Equation (48) and Equation (9). The only difference is the replacement of G$_n$(z)S(z) in Equation (9) with G'(z) used Equation (48). Recall that Equation (9) was the equation used to develop the block diagram shown in FIG. 8. This completes the proof that the block diagram shown in FIG. 15 for a linear system is functionally equivalent to the block diagram shown in FIG. 8.

Training a Non-Linear System Containing Multi-Variable Power Series

Figure 18:
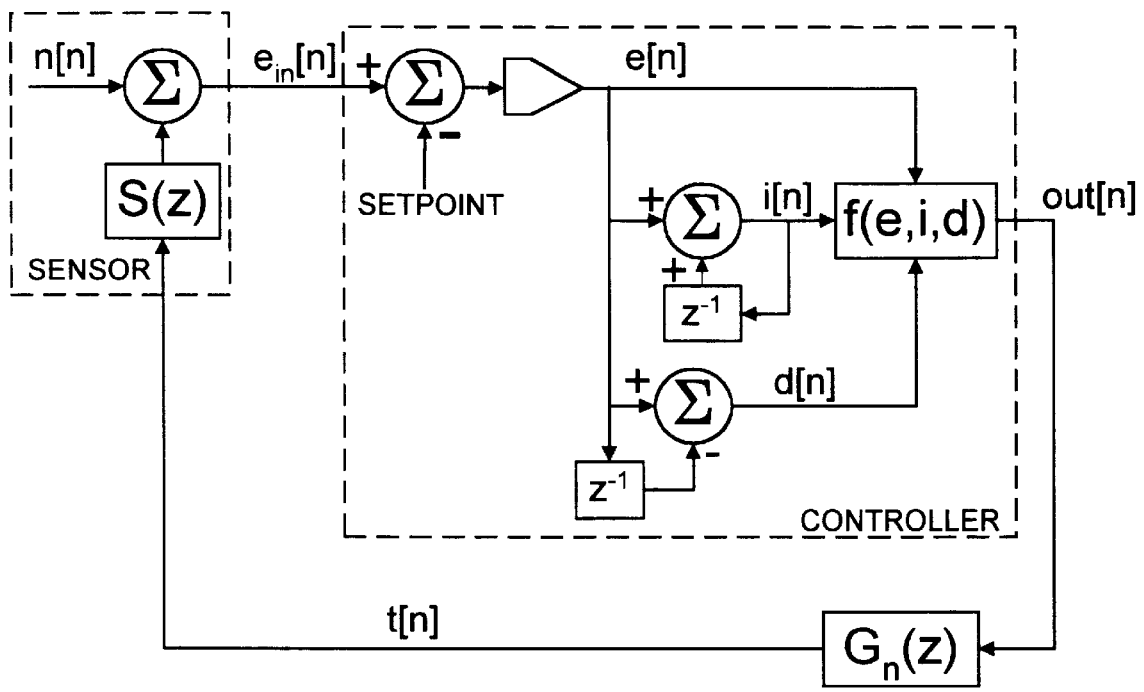
FIG. 18 shows a controller incorporating a multi-dimensional power series non-linear element in a control loop.

The non-linearity that will be used will be a multi-variable power series and will be used in a control system as shown in FIG. 18. In this control system instead of the output of the controller being determined by a linear combination of error, integral and derivative variables, it will be function of the power series f(e,i,d). The power series will be of the form:

$$f(e, i, d) = \sum_{v,x,y=0}^{V,X,Y} a_{vxy}e^v i^x d^y \quad (49)$$

Figure 19:
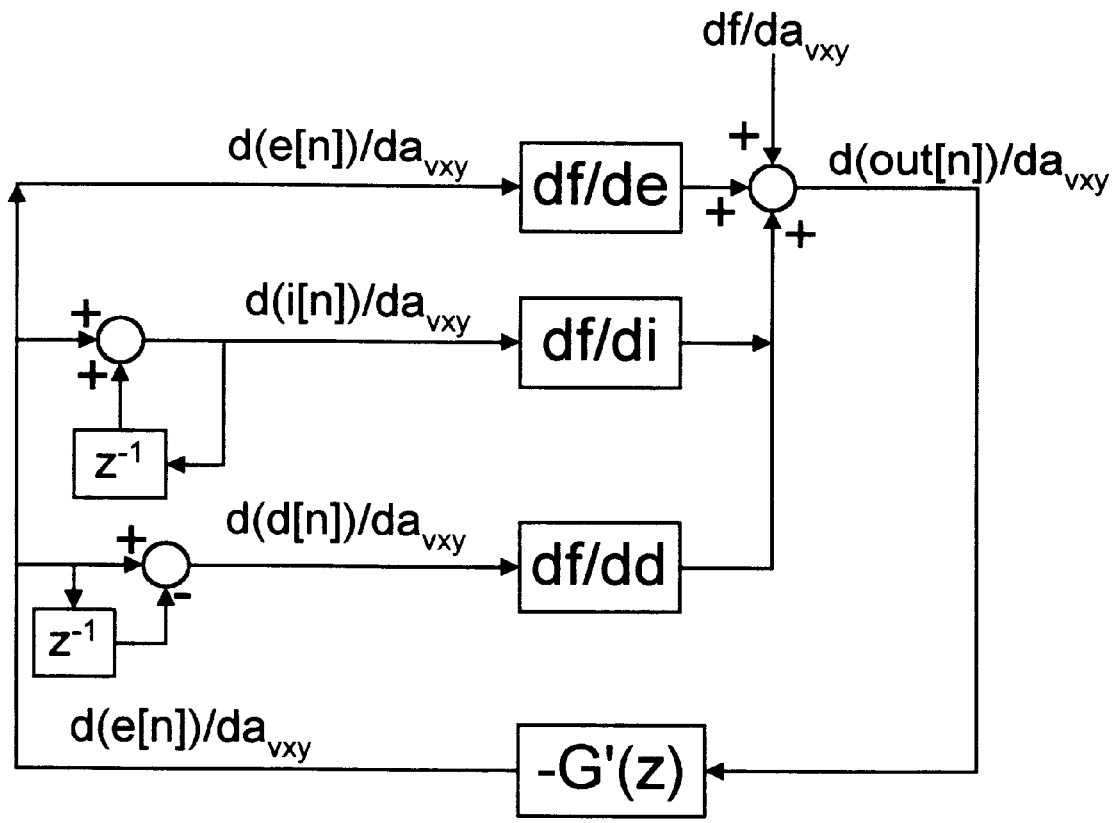
FIG. 19 shows a flow diagram for determining the derivative signal d(e[n])/da$_i$ for parameters in the multi-dimensional power series non-linear element shown in FIG. 18.

The technique used for calculating the derivative functions will be identical to that used to calculate the derivative function when dealing with functions of one variable. The flow graph utilizing this technique is shown in FIG. 19 and built on the equation:

$$out = f(e,i,d)$$

$$\frac{d\,out}{da_{vxy}} = \left(\frac{df}{de}\right)\left(\frac{de}{da_{vxy}}\right) + \left(\frac{df}{di}\right)\left(\frac{di}{da_{vxy}}\right) + \left(\frac{df}{dd}\right)\left(\frac{dd}{da_{vxy}}\right) + \frac{df}{da_{vxy}} \quad (50)$$

As in the single variable power series the values of df/de, df/di and df/dd are values determined from the non-linear function in the actual control loop and is determined by the values of e, i and d. The values of these functions can be determined by the following equations:

$$\frac{df}{de} = \sum_{v=1,x,y=0}^{V,X,Y} a_{vxy}ve^{v-1}i^x d^y \quad (51)$$

$$\frac{df}{di} = \sum_{x=1,v,y=0}^{X,V,Y} a_{vxy}xe^v i^{x-1} d^y \quad (52)$$

$$\frac{df}{dd} = \sum_{y=1,v,x=0}^{Y,V,X} a_{vxy}ye^v i^x d^{y-1} \quad (53)$$

Returning to Equation (50) the values of de/da$_{vxy}$, di/da$_{vxy}$ and dd/da$_{vxy}$ are the values of the variable functions in the flow graphs used to evaluate the derivative functions. The only variable in Equation (50) that has not been defined is df/da$_{vxy}$. The value of this variable can be determined by the following equation.

$$\frac{df}{da_{vxy}} = e^v i^x d^y \quad (54)$$

The values of e, i, d are the values of the variables in the main control loop controlling the process.

Assumption of Linearity

The assumption of linearity was made at many points in this discussion. The specific point of interest is determining the value of the constant used to determine the change in value of a parameter based on the error and the derivative of that parameter with the error. The normal equation used to calculate change of parameters is:

$$\Delta a_i = \frac{\left(\frac{de}{da_i}\right)\text{error}}{K} \quad (55)$$

The change in the value of output or error should be made as close as possible equal to the value of error. By making the assumption of linearity and independence of the parameters, the amount of change in the output of the system as a result of the change of parameter can be calculated from:

$$\text{change out} = \sum_{\text{all } i} \Delta a_i \left(\frac{de}{da_i}\right) \quad (56)$$

By substituting the value from Equation (55) for $a_i$ in Equation (56) and rearranging the results is:

$$\text{change out} = \left(\frac{\text{error}}{K}\right) \sum_{\text{all } i} \left(\frac{de}{da_i}\right)^2 \quad (57)$$

By equating the value of change out to error the value of K can be determined.

$$K = \sum_{\text{all } i} \left(\frac{de}{da_i}\right)^2 \quad (58)$$

Accelerated Convergence Using Simultaneous, Linked Training

In the remainder of this section, the discussion will disclose a technique for increasing the rate of convergence using a matrix to permit the simultaneous learning of a number of data points. The techniques used in this discussion are based on the assumption of linearity. For large parameter changes this assumption is false. This is because of both the non-linearity of the power series and the non-linearity of a recursive system. For small parameter changes the assumption of linearity may be useful and the matrix technique could be used.

Updating a system's parameters using one training data will in general change the system's output for all of the system's inputs. Therefore, updating the system's parameters for one training data point v will generally, to some degree, undo the work of previous training by changing the system's output for another, previously-used training data point n. This behavior causes the overall convergence of the system to proceed rather slowly.

During training, updating system parameters using one training data point n changes the error signal e at data point v by an amount:

$$\text{change } e|_v = \sum_{\text{all } i} (\Delta a_i)|_n \left(\frac{de}{da_i}\Big|_v\right) \quad (59)$$

where $|_n$ and "i" mean "evaluated at data point n," and $|_v$ means "evaluated at data point v." This change in error signal e at data point v that results from adjusting parameters at data point n is:

$$\text{change } e|_v = \sum_{\text{all } i} \left(\frac{de}{da_i}\Big|_n \frac{\text{ERR}_{\text{applied},n}}{K_n}\right)\left(\frac{de}{da_i}\Big|_v\right) \quad (60)$$

from Equation (59) and substituting the value of $\Delta a_i$ from Equation (55). Substituting the value of $K_n$ from Equation (58) into Equation (60) gives:

$$\text{change } e|_v = \left(\frac{\sum_{\text{all } i}\left(\frac{de}{da_i}\Big|_n\right)\left(\frac{de}{da_i}\Big|_v\right)}{\sum_{\text{all } i}\left(\frac{de}{da_i}\Big|_n\right)^2}\right) \text{ERR}_{\text{applied},n} \quad (61)$$

wherein $\text{ERR}_{\text{applied},n}$ is the applied error used during parameter updating for the training of data point n, and the quantity in large parentheses is called the "coupling" $G_{nv}$ from data point n to point v:

$$G_{nv} = \frac{\sum_{\text{all } i}\left(\frac{de}{da_i}\Big|_n\right)\left(\frac{de}{da_i}\Big|_v\right)}{\sum_{\text{all } i}\left(\frac{de}{da_i}\Big|_n\right)} \quad (62)$$

Using matrix notation, after updating parameters for both points n and v, the observable difference output $\text{ERR}_{\text{actual}}$ for primary inputs of points n and v are:

$$\begin{bmatrix} 1 & G_{21} \\ G_{12} & 1 \end{bmatrix} \begin{bmatrix} \text{ERR}_{\text{applied},1} \\ \text{ERR}_{\text{applied},2} \end{bmatrix} = \begin{bmatrix} \text{ERR}_{\text{actual},1} \\ \text{ERR}_{\text{actual},2} \end{bmatrix} \quad (63)$$

The equation can be generalized for an arbitrary number U of points 1, ..., U as follows:

$$\begin{bmatrix} 1 & G_{21} & \ldots & G_{U1} \\ G_{12} & 1 & \ldots & G_{U2} \\ \ldots & \ldots & 1 & \ldots \\ G_{1U} & G_{2U} & \ldots & 1 \end{bmatrix} \begin{bmatrix} \text{ERR}_{\text{applied},1} \\ \text{ERR}_{\text{applied},2} \\ \ldots \\ \text{ERR}_{\text{applied},U} \end{bmatrix} = \begin{bmatrix} \text{ERR}_{\text{actual},1} \\ \text{ERR}_{\text{actual},2} \\ \ldots \\ \text{ERR}_{\text{actual},U} \end{bmatrix} \quad (64)$$

This is a linear equation wherein the errors on the right are the product of coupling coefficients and applied errors on the left.

In a preferred embodiment of the present invention, the system trainer achieves overall convergence at a dramatically accelerated rate by the following method.

The system trainer while updating parameters using point n does not simply set $\text{ERR}_{\text{applied},n}$ to $\text{ERR}_{\text{actual},n}$, to thereby exactly correct error signal e.

Instead, the system trainer anticipates the subsequent change in error signal e as evaluated at the point n due to subsequent updating of parameters using a number U of other points. The system trainer selects the correction $\text{ERR}_{\text{applied}}$ used for updating at all U points such that, together, they cause error signal e to change exactly by the correct amount as evaluated at all points U.

In particular, the system trainer includes a coupling calculator, not pictured, that calculates the coupling matrix of Equation (64). The system trainer then selects the $\text{ERR}_{\text{applied}}$ for all U training data points such that they satisfy Equation (64). A person skilled in the art would know that $\text{ERR}_{\text{applied}}$ can be selected to satisfy Equation (64) using standard linear algebra techniques such as Gaussian elimination.

As a review the equations used to calculate the change in the parameter values will now be shown.

$$\Delta a_i = \sum_{n=1}^{U} \left( \frac{de}{da_i} \bigg|_n \right) \frac{ERR_{applied,n}}{K_n} \quad (65)$$

where:

$$K_n = \sum_{all\ i} \left( \frac{de}{da_i} \bigg|_n \right)^2 \quad (66)$$

LINEAR SYSTEM WITH A LEAD-LAG NETWORK

Figure 20:
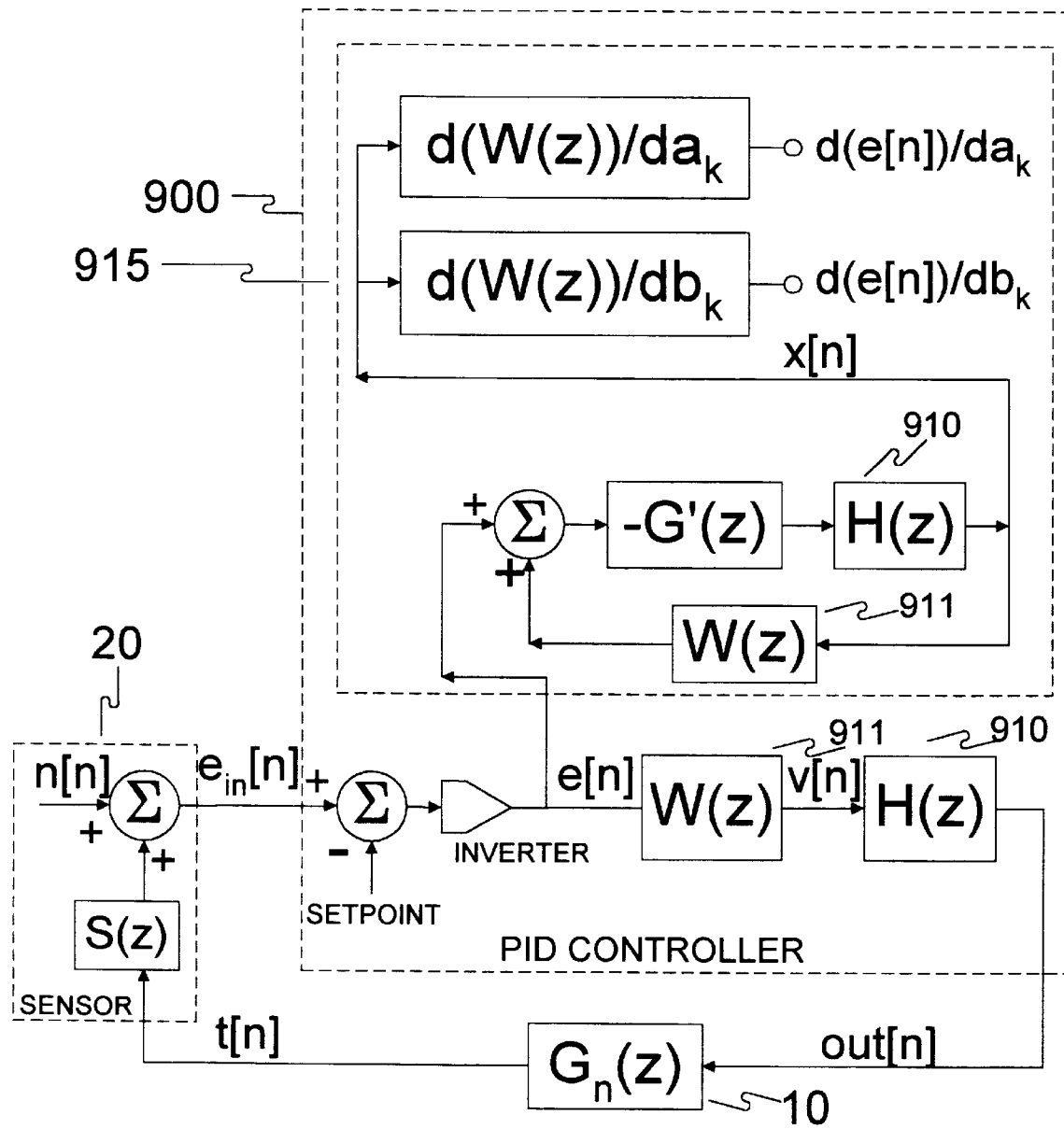
FIG. 20 shows a block diagram for a controller containing a lead-lag network as well as some circuitry for calculating the derivative signals for parameters in the lead-lag network.
Figure 21A:
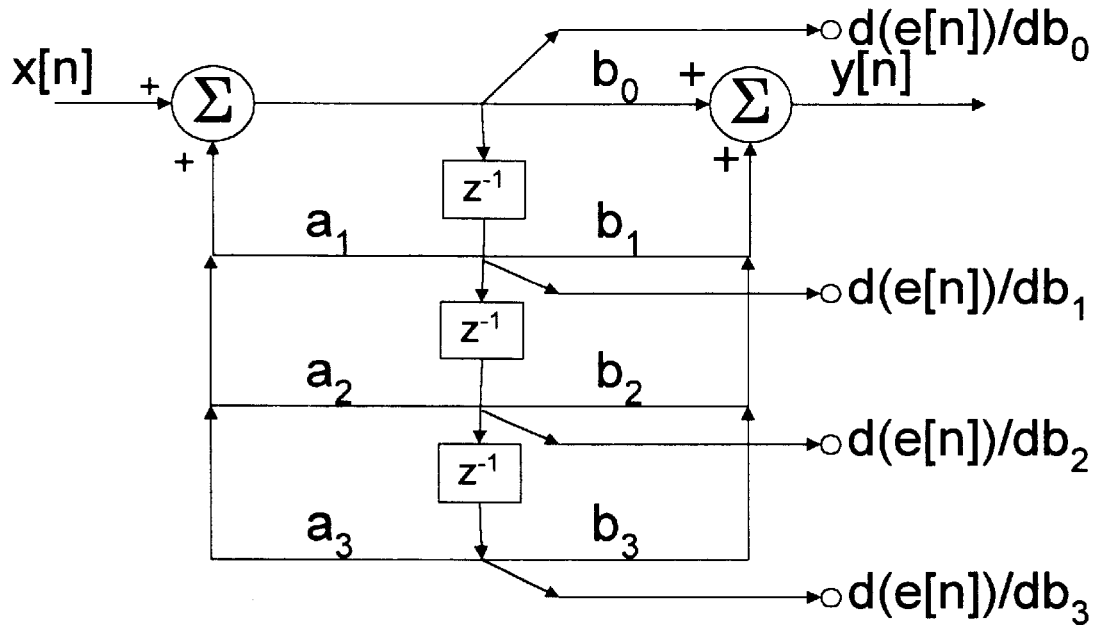
FIGS. 21a–b show more detailed circuitry for calculating the derivative signals for the recursive and non-recursive parameters

With the techniques developed, it is now possible to continue with the analysis of a linear system. The system that will be analyzed contains a lead-lag network in addition to the normal P, I and D parameters. This control loop is shown in FIG. 20. In FIG. 20, the PID parameters are in H(z) block 910, while the lead-lag parameters are in the W(z) block 911. The PID controller conponents are located in block 900 and the error derivative signals are calculated in block 915. The error derivative signals will be calculated for all parameters in the system. These include the P, I and D values in H(z) as will as all the $a_k$ and $b_k$ parameters in the lead-lag network W(z). The structure of W(z) is shown in FIG. 21a. The depth of W(z) is optional. The first step in the development of the error derivative signals is to list the transfer equations that define the control loop.

$$E(z) = -G^j(Z)OUT(z) \quad (67)$$

$$V(z) = W(z)E(z) \quad (68)$$

$$OUT(z) = H(z)V(z) \quad (69)$$

In this set of equations the product $S(z)G_n(z)$ has been replaced with G'(z). The derivative signal for $a_k$ in W(z) will now be calculated.

$$\frac{d(E(z))}{da_k} = -G'(z)H(z)\frac{d(V(z))}{da_k} \quad (70)$$

$$\frac{d(V(z))}{da_k} = \frac{d(W(z))}{da_k}E(z) + W(z)\frac{d(E(z))}{da_k} \quad (71)$$

By substituting the results of Equation (71) into Equation (70) and rearranging the results is:

$$\frac{d(E(z))}{da_k}(1 + G'(z)H(z)W(z)) = -G'(z)H(z)\frac{d(W(z))}{da_k}E(z)$$

This leads to the following transfer equation:

$$\frac{d(E(z))}{da_k} = \frac{-G'(z)H(z)\frac{d(W(z))}{da_k}E(z)}{1 + G'(z)H(z)W(z)} \quad (72)$$

This transfer equation leads to the block diagram shown in FIG. 20. When a similar procedure is followed to calculate the transfer equation for the derivative signal of the derivatives of $b_k$ with error signal E(z) the results is:

$$\frac{d(E(z))}{db_k} = \frac{-G'(z)H(z)\frac{d(W(z))}{db_k}E(z)}{1 + G'(z)H(z)W(z)} \quad (73)$$

It is of course desired to combine the block diagrams for the production of the derivative signal of Equation (72) and Equation (73). A first attempt is shown in FIG. 20. The first step to develop a procedure that is more accurate than that shown in FIG. 20 is to examine the derivatives of W(z) with respect to $a_k$ and $b_k$.

$$W(z) = \frac{\sum_{k=0}^{3} b_k z^{-k}}{1 - \sum_{k=1}^{3} a_k z^{-k}} \quad (74)$$

$$\frac{d(W(z))}{db_k} = \frac{z^{-k}}{1 - \sum_{n=1}^{3} a_n z^{-n}} \quad (75)$$

$$\frac{d(W(z))}{da_k} = \frac{z^{-k}\sum_{n=0}^{3} b_n z^{-n}}{\left(1 - \sum_{n=1}^{3} a_n z^{-n}\right)^2} = \frac{W(z)z^{-k}}{1 - \sum_{n=1}^{3} a_n z^{-n}} \quad (76)$$

Figure 21B:
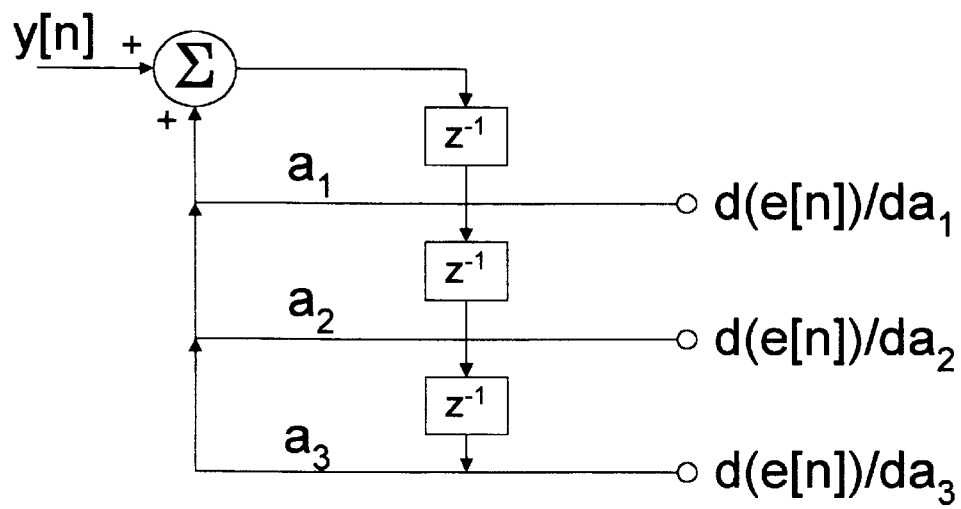

If the x[n] signal from FIG. 20 is sent to FIG. 21a the derivative of error or e[n] with respect to the $b_k$ parameters can be determined. If the y[n] signal from FIG. 21a is sent to FIG. 21b the derivatives of error or e[n] with respect to $a_k$ parameters can be determined. FIG. 21a and FIG. 21b show how the derivative signals are evaluated. These block diagrams flow directly from Equations (75) and (76) and the block diagram shown in FIG. 20.

A similar procedure will now be followed to find the transfer function for the derivatives of error or e[n] with the parameters of H(z). Working with Equations (67), (68) and (69):

$$\frac{d(E(z))}{dP} = -G'(z)\frac{d(OUT(z))}{dP} \quad (77)$$

$$\frac{d(OUT(z))}{dP} = \frac{d(H(z))}{dP}V(z) + H(z)\frac{d(V(z))}{dP} \quad (78)$$

$$\frac{d(V(z))}{dP} = W(z)\frac{d(E(z))}{dP} \quad (79)$$

Since the value of d(H(z))/dP is one and using the results of Equation (79) and (69), Equation (78) can be simplified to:

$$\frac{d(OUT(z))}{dP} = W(z)E(z) + H(z)W(z)\frac{d(E(z))}{dP} \quad (80)$$

By substituting the results of Equation (80) into Equation (77) the results is:

$$\frac{d(E(z))}{dP} = -G'(z)W(z)E(z) - G'(z)H(z)W(z)\frac{d(E(z))}{dP}$$

By collecting terms and dividing the transfer function can be determined:

$$\frac{d(E(z))}{dP} = \frac{-G'(z)W(z)E(z)}{1+G'(z)H(z)W(z)} \qquad (81)$$

A similar procedure can be followed to develop the transfer function for the derivative signals of d(e[n])/dI and d(e[n])/dD. Following this procedure leads to the following equations:

$$\frac{d(E(z))}{dI} = \left(\frac{-G'(z)W(z)E(z)}{1+G'(z)H(z)W(z)}\right)\left(\frac{1}{1+z^{-1}}\right) \qquad (82)$$

$$\frac{d(E(z))}{dD} = \left(\frac{-G'(z)W(z)E(z)}{1+G'(z)H(z)W(z)}\right)(1-z^{-1}) \qquad (83)$$

Figure 22:
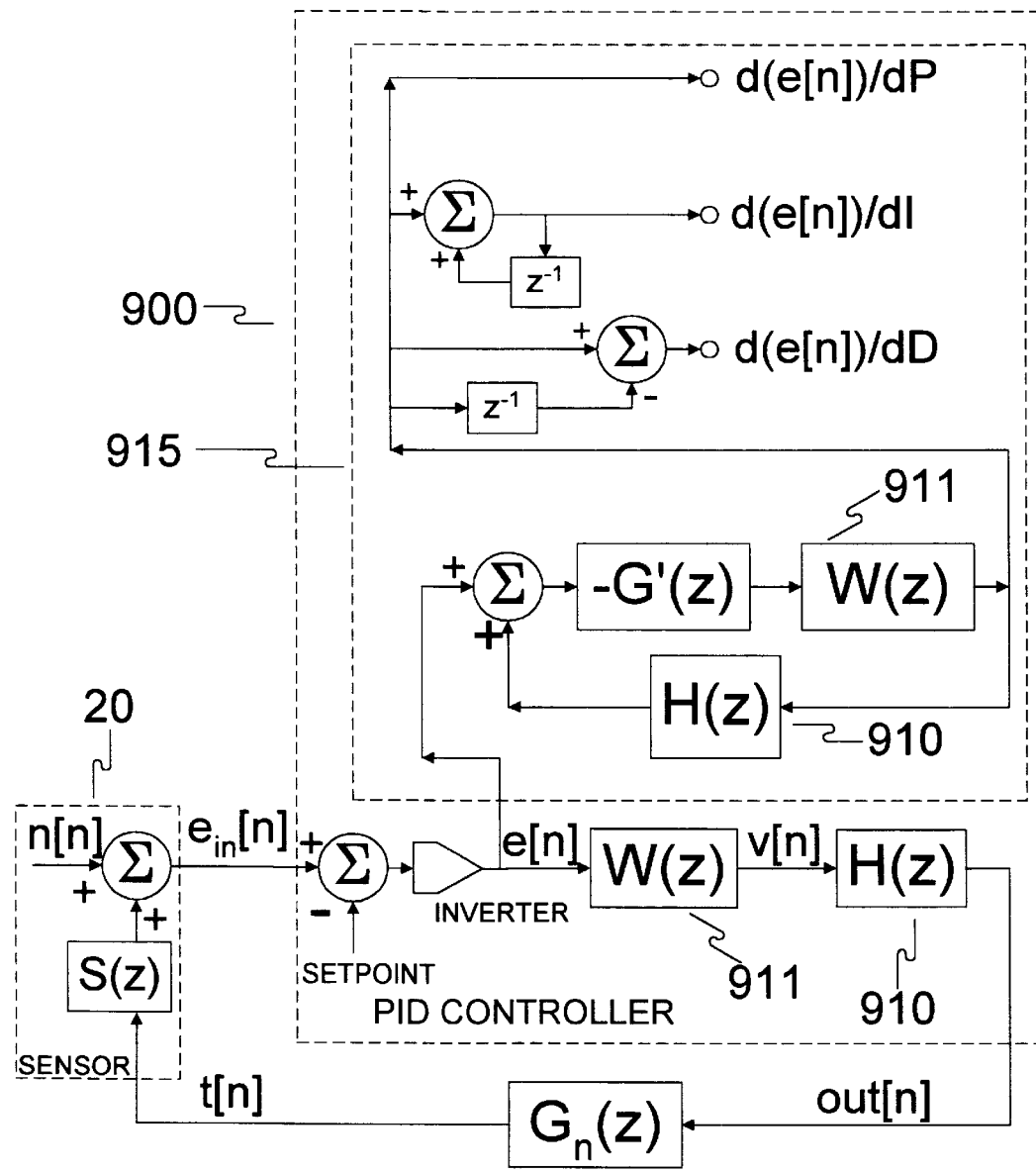
FIG. 22 shows a block diagram for calculating the derivative signals for the P, I and D parameters for controller first shown in FIG. 20.

The block diagram shown in FIG. 22 can be derived from Equations (81), (82) and (83). Observe that the block diagrams shown in FIGS. 20 and 22 can not be combined because of the difference in the structure of the feedback network.

By using the block diagrams in FIGS. 20, 21a–b, and 22 the derivative of the error with all parameters in the system can be determined. The level of error can be reduced by using the derivative signal along with the error itself to change the values of the parameters. This procedure is called the LMS algorithm. This example was meant to illustrate that this technique is as applicable to complex systems as it is to simple systems. The only restriction to its use should be the amount of computations required to calculate the derivative signals.

I claim:

1. In a controller for controlling an external process, a method of adjusting in real time a plurality of parameters comprising the controller, the controller producing a control signal which controls the external process, the method comprising steps of:

(a) taking a measurement to produce a process signal representative of a process variable of the process being controlled, the process variable varying in response to the control signal;

(b) producing an error signal representative of the difference between the process signal and a setpoint signal;

(c) for each of the parameters, producing an error derivative signal representative of the derivative of the error signal with respect to the parameter;

(d) combining the error signal with the error derivative signals to produce adjustment signals; and (e) adjusting the parameters based on the adjustment signals.

2. The method of claim 1 wherein the controller includes a filter and the step of producing the error derivative signal includes producing signals representative of the derivative of error with respect to each of the parameters comprising the filter.

3. The method of claim 1 wherein the controller is a proportional gain (P), integral gain (I), and derivative gain (D) controller.

4. The method of claim 1 wherein the step of producing the error derivative signal includes modeling the external transfer function of the external process with a first model, the external transfer function being external to the controller and existing between an input and an output of the controller.

5. The method of claim 4 wherein the step of producing the error derivative signal further includes supplying the error signal to a feedback loop comprising the first model and a model of the transfer function representative of the controller.

6. The method of claim 4 wherein the first model is a digital filter having a plurality of filter parameters, the step of modeling including adapting the filter parameters to approximate the external process, including:

(i) producing a noise signal from an artificial noise source;

(ii) supplying the noise signal to the external process and to the filter to produce output signals therefrom;

(iii) subtracting an output signal of the filter from an output signal of the external process to produce an error signal;

(iv) producing a plurality of derivative signals, each derivative signal being representative of a derivative of the output signal of the filter with respect to a filter parameter; and (v) updating each of the filter parameters based on the derivative signals and the error signal.

7. The method of claim 6 wherein the digital filter includes recursive parameters.

8. The method of claim 1 further including:

providing a reference model which duplicates the controller, the reference model having a plurality of parameters;

supplying a constant-valued signal to the reference model thereby producing an output signal;

adjusting parameters of the reference model based on the adjustment signals used to adjust the parameters of the controller;

monitoring fluctuations in the output signal of the reference model; and repeating steps (a)–(e) when fluctuations in the output signal of the reference model fall within a user-defined range.

9. The method of claim 8 wherein the step of adjusting parameters of the reference model coincides with adjustment of the parameters of the controller.

10. The method of claim 1 wherein the controller is a linear controller.

11. The method of claim 1 wherein the controller is a non-linear controller.

12. In a feedback control system comprising a process to be controlled and a sensor for measuring a process variable of the process being controlled, a feedback controller for producing a control signal to control the process, the feedback controller comprising:

a setpoint selector for specifying a setpoint value representative of a desired value of the process variable;

a comparator in communication with both the sensor and the setpoint selector to produce an error signal representative of the differences between the setpoint value and measurements of the process variable;

a control signal generator coupled to the comparator to receive the error signal therefrom and to produce the control signal thereby, the control signal generator having an associated transfer function, the transfer function comprising a plurality of parameters;

a derivative signal generator coupled to receive the error signal from the comparator to produce error derivative signals representative of the derivative of the error signal with respect to each of the parameters of the transfer function associated with the control signal generator; and an adjustment value generator coupled to receive the error derivative signals from the derivative signal generator and to receive the error signal from the comparator to produce adjustment values;

the control signal generator having a signal path to receive adjustment values from the adjustment value generator to update the parameters of the associated transfer function.

13. The feedback control system of claim 12 wherein the derivative signal generator includes an external transfer function representative of the process to be controlled.

14. The feedback control system of claim 13 wherein the derivative signal generator includes a signal path to feed the error signal to a feedback loop comprising the external transfer function and the transfer function of the controller.

15. The feedback control system of claim 12 further including a reference model representative of the feedback controller, the reference model having a constant-valued input signal and producing an output signal; the reference model producing an update signal in response to the output signal being within a user-definable range of values; wherein the feedback controller updates the parameter of the transfer function associated with the control signal generator in response to the update signal.

16. The feedback control system of claim 15 wherein the reference model includes parameters which are updated in response to the update signal.

17. The feedback controller system of claim 12 wherein the controller includes linear elements.

18. The feedback controller system of claim 12 wherein the controller includes non-linear elements.

* * * * *